United States Patent
Tajima et al.

(10) Patent No.: US 9,178,111 B2
(45) Date of Patent: Nov. 3, 2015

(54) SEMICONDUCTOR LIGHT EMITTING DEVICE

(71) Applicant: Kabushiki Kaisha Toshiba, Minato-ku (JP)

(72) Inventors: Jumpei Tajima, Tokyo (JP); Kotaro Zaima, Ishikawa-ken (JP); Toshiki Hikosaka, Kanagawa-ken (JP); Hiroshi Ono, Tokyo (JP); Naoharu Sugiyama, Kanagawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 53 days.

(21) Appl. No.: 14/083,927

(22) Filed: Nov. 19, 2013

(65) Prior Publication Data
US 2014/0167094 A1    Jun. 19, 2014

(30) Foreign Application Priority Data
Dec. 18, 2012 (JP) .................... 2012-275898

(51) Int. Cl.
*H01L 33/00* (2010.01)
*H01L 27/14* (2006.01)
(Continued)

(52) U.S. Cl.
CPC ............ *H01L 33/18* (2013.01); *H01L 33/382* (2013.01); *H01L 21/02027* (2013.01);
(Continued)

(58) Field of Classification Search
CPC ......... H01L 33/16; H01L 33/18; H01L 33/20; H01L 33/22; H01L 33/32; H01L 33/36; H01L 33/38; H01L 33/382; H01L 21/02027; H01L 21/02516; H01L 21/02609; H01L 29/04; H01L 31/036; H01L 31/0224; H01L 51/441; H01L 2933/0016
USPC ............... 257/99, 431, 432, 734, 773; 438/29
See application file for complete search history.

(56) References Cited

U.S. PATENT DOCUMENTS 5,886,360 A * 3/1999 Ochi ............................... 257/15
8,390,010 B2 * 3/2013 Sills et al. ....................... 257/98
(Continued)

FOREIGN PATENT DOCUMENTS

WO    WO 2009/054088 A1    4/2009

OTHER PUBLICATIONS

U.S. Appl. No. 13/727,147, filed Dec. 26, 2012, Jumpei Tajima, et al.

*Primary Examiner* — Teresa M Arroyo
(74) *Attorney, Agent, or Firm* — Oblon, McClelland, Maier & Neustadt, L.L.P.

(57) ABSTRACT

According to one embodiment, a semiconductor light emitting device includes an electrode layer, a first semiconductor layer, a first elongated electrode, a second semiconductor layer, and a light emitting layer. The first semiconductor layer includes a crystal having a cleavage plane. The first semiconductor layer includes a first thin film portion and a thick film portion. The first thin film portion extends in a first direction perpendicular to a stacking direction from the electrode layer toward the first semiconductor layer. The first thin film portion has a first thickness. The thick film portion is arranged with the first thin film portion in a plane perpendicular to the stacking direction. An angle between the first direction and the cleavage plane is not less than 3 degrees and not more than 27 degrees. The first elongated electrode extends in the first direction in contact with the first thin film portion.

20 Claims, 10 Drawing Sheets

(51) Int. Cl.

| | |
|---|---|
| *H01L 31/0232* | (2014.01) |
| *H01L 23/48* | (2006.01) |
| *H01L 23/52* | (2006.01) |
| *H01L 29/40* | (2006.01) |
| *H01L 33/18* | (2010.01) |
| *H01L 29/04* | (2006.01) |
| *H01L 33/36* | (2010.01) |
| *H01L 51/44* | (2006.01) |
| *H01L 33/38* | (2010.01) |
| *H01L 33/16* | (2010.01) |
| *H01L 21/02* | (2006.01) |
| *H01L 31/036* | (2006.01) |
| *H01L 33/20* | (2010.01) |
| *H01L 31/0224* | (2006.01) |
| *H01L 33/22* | (2010.01) |
| *H01L 33/32* | (2010.01) |

(52) U.S. Cl.
CPC .... *H01L 21/02516* (2013.01); *H01L 21/02609* (2013.01); *H01L 29/04* (2013.01); *H01L 31/0224* (2013.01); *H01L 31/036* (2013.01); *H01L 33/16* (2013.01); *H01L 33/20* (2013.01); *H01L 33/22* (2013.01); *H01L 33/32* (2013.01); *H01L 33/36* (2013.01); *H01L 33/38* (2013.01); *H01L 51/441* (2013.01); *H01L 2933/0016* (2013.01)

(56) References Cited

U.S. PATENT DOCUMENTS

| | | | |
|---|---|---|---|
| 8,852,965 B2* | 10/2014 | Fujikane et al. | 438/7 |
| 2010/0237382 A1* | 9/2010 | Kamei | 257/99 |
| 2011/0062488 A1* | 3/2011 | Uemura et al. | 257/103 |
| 2013/0126900 A1* | 5/2013 | Inoue et al. | 257/76 |
| 2013/0175566 A1* | 7/2013 | Inoue et al. | 257/98 |
| 2013/0244360 A1 | 9/2013 | Sato et al. | |
| 2013/0285069 A1* | 10/2013 | Yano et al. | 257/77 |
| 2013/0328075 A1* | 12/2013 | Tajima et al. | 257/94 |
| 2014/0015105 A1* | 1/2014 | Toba et al. | 257/615 |
| 2014/0054594 A1* | 2/2014 | Katsuno et al. | 257/76 |
| 2014/0070255 A1* | 3/2014 | Inoue et al. | 257/98 |

* cited by examiner

SEMICONDUCTOR LIGHT EMITTING DEVICE

CROSS-REFERENCE TO RELATED APPLICATIONS

This application is based upon and claims the benefit of priority from Japanese Patent Application No. 2012-275898, filed on Dec. 18, 2012; the entire contents of which are incorporated herein by reference.

FIELD

Embodiments described herein relate generally to a semiconductor light emitting device.

BACKGROUND

Semiconductor light emitting devices such as light emitting diodes (LEDs), laser diodes (LDs), etc., include, for example, a semiconductor crystal and the like. Cracks may occur in the semiconductor light emitting device due to stress applied to the semiconductor crystal, etc.

DETAILED DESCRIPTION

Figure 1:
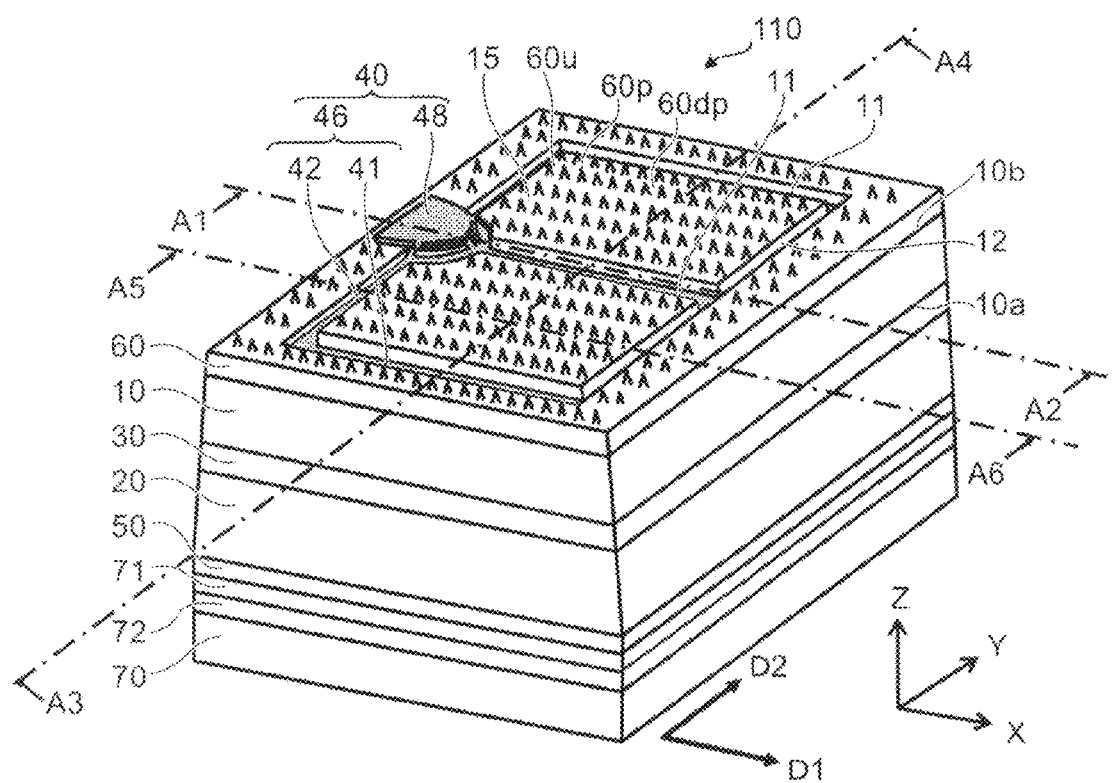
FIG. 1 is a schematic perspective view showing a semiconductor light emitting device according to a first embodiment.

In general, according to one embodiment, a semiconductor light emitting device includes an electrode layer, a first semiconductor layer, a first elongated electrode, a second semiconductor layer, and a light emitting layer. The first semiconductor layer is of a first conductivity type. The first semiconductor layer includes a crystal having a cleavage plane. The first semiconductor layer includes a first thin film portion and a thick film portion. The first thin film portion extends in a first direction perpendicular to a stacking direction from the electrode layer toward the first semiconductor layer. The first thin film portion has a first thickness. The thick film portion is arranged with the first thin film portion in a plane perpendicular to the stacking direction. The thick film portion has a second thickness thicker than the first thickness. An angle between the first direction and the cleavage plane is not less than 3 degrees and not more than 27 degrees. The first elongated electrode extends in the first direction and is in contact with the first thin film portion. The second semiconductor layer of a second conductivity type is provided between the electrode layer and the first semiconductor layer to be electrically connected to the electrode layer. The light emitting layer is provided between the first semiconductor layer and the second semiconductor layer.

In general, according to another embodiment, a semiconductor light emitting device includes an electrode layer, a first semiconductor layer, a first elongated electrode, a second semiconductor layer and a light emitting layer. The first semiconductor layer is of a first conductivity type. The first semiconductor layer includes a crystal having a cleavage plane. The first semiconductor layer includes a first thin film portion and a thick film portion. The first thin film portion extends in a first direction perpendicular to a stacking direction from the electrode layer toward the first semiconductor layer. The first thin film portion has a first thickness. The thick film portion is arranged with the first thin film portion in a plane perpendicular to the stacking direction. The thick film portion has a second thickness thicker than the first thickness. The first elongated electrode extends in the first direction and is in contact with the first thin film portion. The second semiconductor layer of a second conductivity type is provided between the electrode layer and the first semiconductor layer to be electrically connected to the electrode layer. The light emitting layer is provided between the first semiconductor layer and the second semiconductor layer. The crystal is a wurtzite-type crystal. At least one selected from an angle between the stacking direction and a (10-10) plane of the wurtzite-type crystal and an angle between the stacking direction and a (11-20) plane of the wurtzite-type crystal is not less than 88 degrees and not more than 92 degrees. An angle between the first direction and a [0001] direction of the wurtzite-type crystal when projected onto the plane perpendicular to the stacking direction is not less than 3 degrees and not more than 87 degrees.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic perspective view showing a semiconductor light emitting device according to a first embodiment.

As shown in FIG. 1, the semiconductor light emitting device 110 according to the embodiment includes a first semiconductor layer 10, a second semiconductor layer 20, a light emitting layer 30, an electrode layer 50, and a first elongated electrode 41. An electrode unit 40 is provided in the semiconductor light emitting device 110; and the first elongated electrode 41 is included in the electrode unit 40.

The second semiconductor layer 20 is provided between the electrode layer 50 and the first semiconductor layer 10. The second semiconductor layer 20 is electrically connected to the electrode layer 50. The light emitting layer 30 is provided between the first semiconductor layer 10 and the second semiconductor layer 20.

For example, the second semiconductor layer 20 is provided on the electrode layer 50. The light emitting layer 30 is provided on the second semiconductor layer 20. The first semiconductor layer 10 is provided on the light emitting layer 30. In the example, the first elongated electrode 41 is provided on a portion of the first semiconductor layer 10.

In the specification of the application, the state of being "provided on" includes not only the state of being provided in direct contact but also the state in which another component is inserted therebetween.

The first semiconductor layer 10 has a first conductivity type; and the second semiconductor layer 20 has a second conductivity type. For example, the first conductivity type is an n type; and the second conductivity type is a p type. The first conductivity type may be the p type; and the second conductivity type may be the n type. In the following example, the first conductivity type is the n type; and the second conductivity type is the p type.

The first semiconductor layer 10 has a first major surface 10a (e.g., the lower surface) and a second major surface 10b (e.g., the upper surface). The first major surface 10a opposes the light emitting layer 30. The second major surface 10b is the side opposite to the first major surface 10a.

The direction from the electrode layer 50 toward the first semiconductor layer 10 is taken as the stacking direction. Also, the stacking direction is the direction from the second semiconductor layer 20 toward the first semiconductor layer 10. The stacking direction is taken as a Z-axis direction. One direction perpendicular to the Z-axis direction is taken as an X-axis direction. A direction perpendicular to the Z-axis direction and perpendicular to the X-axis direction is taken as a Y-axis direction. The X-Y plane is perpendicular to the stacking direction.

The first major surface 10a and the second major surface 10b are substantially perpendicular to the Z-axis direction. The first major surface 10a and the second major surface 10b are substantially parallel to the X-Y plane.

In the example as shown in FIG. 1, the semiconductor light emitting device 110 further includes a substrate 70, a first intermediate conductive layer 71, a second intermediate conductive layer 72, and a low impurity concentration layer 60.

The substrate 70 is conductive. The substrate 70 is, for example, a crystal substrate. The electrode layer 50 is disposed between the second semiconductor layer 20 and the substrate 70 (e.g., the crystal substrate).

The second intermediate conductive layer 72 is provided on the substrate 70. The first intermediate conductive layer 71 is provided on the second intermediate conductive layer 72. The electrode layer 50 is provided on the first intermediate conductive layer 71. The second semiconductor layer 20, the light emitting layer 30, and the first semiconductor layer 10 are provided in this order on the electrode layer 50. The low impurity concentration layer 60 is provided on the first semiconductor layer 10.

For example, a substrate of a silicon crystal is used as the substrate 70. A metal substrate, etc., may be used as the substrate 70. The second intermediate conductive layer 72 includes, for example, a metal (including alloys). The first intermediate conductive layer 71 includes, for example, a metal (including alloys).

The second semiconductor layer 20, the light emitting layer 30, the first semiconductor layer 10, and the low impurity concentration layer 60 include, for example, a semiconductor crystal. The second semiconductor layer 20, the light emitting layer 30, and the first semiconductor layer 10 may include, for example, a crystal of a nitride semiconductor.

The low impurity concentration layer 60 includes a nitride semiconductor. The impurity concentration of the low impurity concentration layer 60 is lower than the impurity concentration of the first semiconductor layer 10. The low impurity concentration layer 60 may not include an impurity. The impurity concentration of the low impurity concentration layer 60 may be lower than the detection limit. The case where the low impurity concentration layer 60 does not include an impurity and the case where the impurity concentration of the low impurity concentration layer 60 is less than the detection limit are included in the state in which the impurity concentration of the low impurity concentration layer 60 is lower than the impurity concentration of the first semiconductor layer 10.

In the example as shown in FIG. 1, the electrode unit 40 includes a pad portion 48 and a fine wire portion 46. The fine wire portion 46 is electrically connected to the pad portion 48. The fine wire portion 46 includes the first elongated electrode 41. In the example, the fine wire portion 46 further includes a second elongated electrode 42. The extension direction of the second elongated electrode 42 intersects (is non-parallel to) the extension direction of the first elongated electrode 41.

In the example, the first elongated electrode 41 extends along a first direction D1. The second elongated electrode 42 extends along a second direction D2. The second direction D2 intersects the first direction D1. The angle between the first direction D1 and the second direction D2 is, for example, not less than 88 degrees and not more than 92 degrees. In the example, the first direction D1 is parallel to the X-axis direction; and the second direction D2 is parallel to the Y-axis direction.

The number of the first elongated electrodes 41 may be one, two, or more. The number of the second elongated electrodes 42 may be one, two, or more. In the example, the number of the first elongated electrodes 41 is three; and the number of the second elongated electrodes 42 is two.

The number of the pad portions 48 may be one, two, or more. The configuration of the pad portion 48 when projected onto the X-Y plane is a rectangle, a polygon, a circle, a flattened circle, etc. The configuration of the pad portion 48 is arbitrary.

Crystal growth of the low impurity concentration layer 60, the first semiconductor layer 10, the light emitting layer 30, and the second semiconductor layer 20 is performed sequentially in this order on a not-shown substrate (growth substrate). These layers are, for example, epitaxially grown. For example, after forming the stacked body including these layers, the electrode layer 50 and the first intermediate conductive layer 71 are formed on the surface of the second semiconductor layer 20. On the other hand, the second intermediate conductive layer 72 is formed on the substrate 70. The first intermediate conductive layer 71 and the second intermediate conductive layer 72 are caused to oppose each other and are bonded to each other. Subsequently, the low impurity concentration layer 60 is exposed by removing the growth substrate. A portion of the surface of the first semiconductor layer 10 is exposed by making a trench in the low impurity concentration layer 60. The first elongated electrode 41, the second elongated electrode 42, and the pad portion 48 are formed on the first semiconductor layer 10 that is exposed. Thereby, the semiconductor light emitting device 110 is formed.

In the semiconductor light emitting device 110, a voltage is applied between the pad portion 48 and the substrate 70. The voltage is applied between the first semiconductor layer 10 and the second semiconductor layer 20 via the fine wire portion 46 (e.g., the first elongated electrode 41, the second elongated electrode 42, etc.) connected to the pad portion 48. Thereby, a current is supplied to the light emitting layer 30. Light is emitted from the light emitting layer 30. The semiconductor light emitting device 110 is, for example, an LED.

As shown in FIG. 1, an unevenness 60dp is provided in the upper surface of the semiconductor light emitting device 110. The light extraction efficiency from the semiconductor light emitting device 110 is increased by the unevenness 60dp. The unevenness 60dp is provided, for example, in an upper surface 60u of the low impurity concentration layer 60. In the case where the low impurity concentration layer 60 is not provided, the unevenness 60dp may be provided in the upper surface of the first semiconductor layer 10.

An example of the first semiconductor layer 10 and the fine wire portion 46 (the first elongated electrode 41 and the second elongated electrode 42) will now be described.

Figure 2:
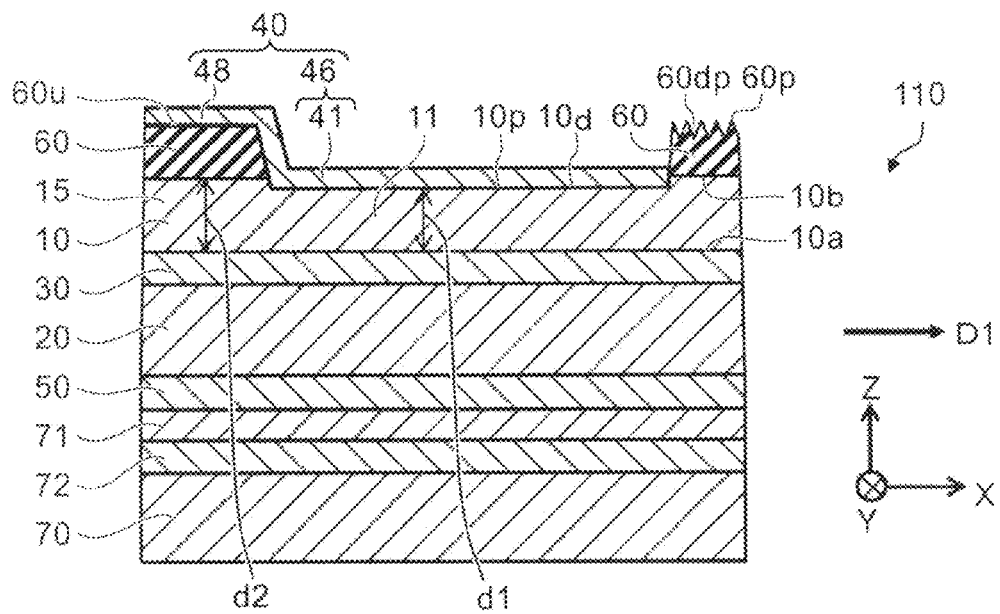
FIG. 2 is a schematic cross-sectional view showing the semiconductor light emitting device according to the first embodiment.
Figure 3:
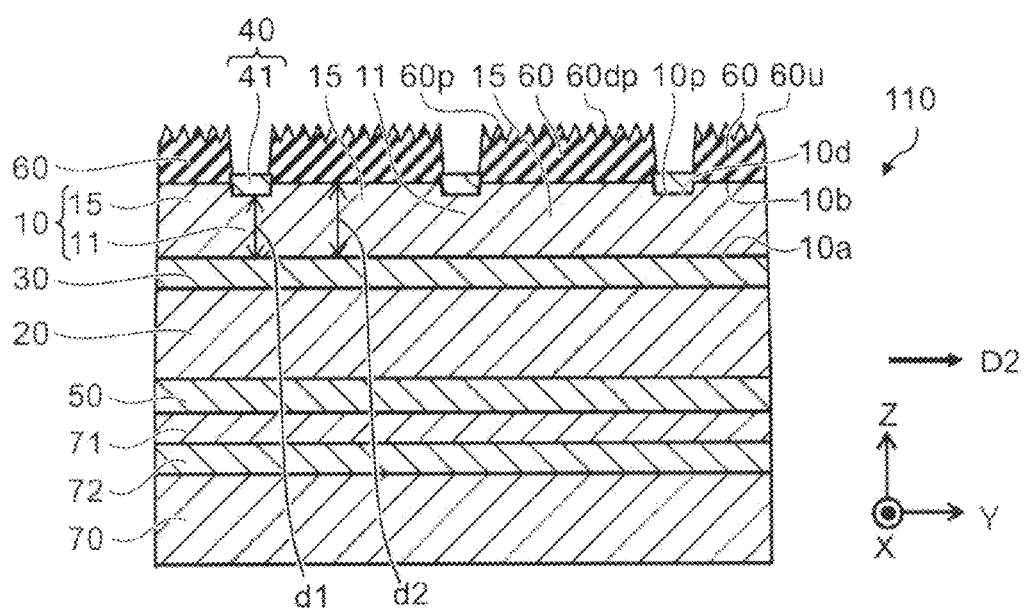
FIG. 3 is a schematic cross-sectional view showing the semiconductor light emitting device according to the first embodiment.
Figure 4:
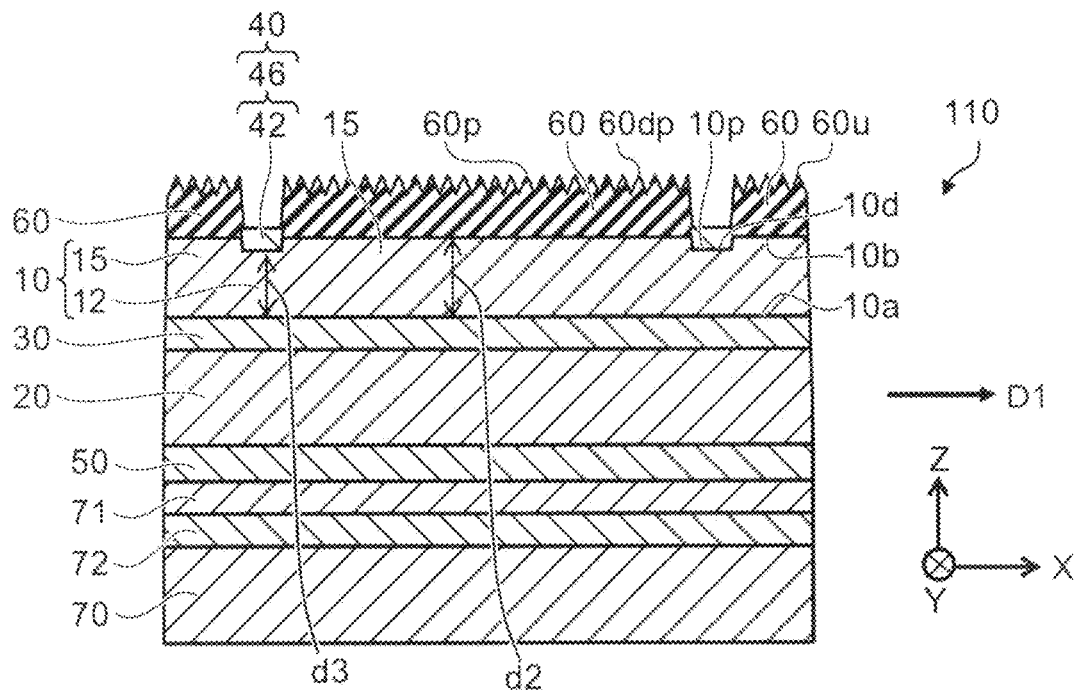
FIG. 4 is a schematic cross-sectional view showing the semiconductor light emitting device according to the first embodiment.

FIG. 2, FIG. 3, and FIG. 4 are schematic cross-sectional views showing the semiconductor light emitting device according to the first embodiment.

FIG. 2 is a cross-sectional view along line A1-A2 of FIG. 1.
FIG. 3 is a cross-sectional view along line A3-A4 of FIG. 1.
FIG. 4 is a cross-sectional view along line A5-A6 of FIG. 1.

As shown in FIG. 2 and FIG. 3, the first semiconductor layer 10 includes a first thin film portion 11 and a thick film portion 15.

The first thin film portion 11 extends along the first direction D1 (the X-axis direction). The first thin film portion 11 has a first thickness d1 (a thickness in the stacking direction). The thick film portion 15 is arranged with the first thin film portion 11 in the X-Y plane (the plane perpendicular to the stacking direction). The thick film portion 15 has a second thickness d2 (a thickness in the stacking direction). The second thickness d2 is thicker than the first thickness d1.

As shown in FIG. 2 and FIG. 3, for example, a recess 10d is provided in the second major surface 10b (the upper surface) of the first semiconductor layer 10. At least a portion of the portion where the recess 10d is provided corresponds to the first thin film portion 11. The recess 10d is provided along the first thin film portion 11. At least a portion of the recess 10d is provided along the extension direction of the first thin film portion 11. The recess 10d has, for example, a trench configuration. Because the recess 10d is provided in the second major surface 10b, the first major surface 10a is flatter than the second major surface 10b.

At least a portion of the fine wire portion 46 is disposed along the first thin film portion 11. For example, the first elongated electrode 41 is disposed at the bottom surface (e.g., a first bottom surface 10p) of the recess 10d. The light emitting layer 30 contacts the first thin film portion 11 and the thick film portion 15.

In the example, the first thin film portion 11 is disposed between the first elongated electrode 41 and the light emitting layer 30. In the example, the thick film portion 15 is disposed between the low impurity concentration layer 60 and the light emitting layer 30.

In the example as shown in FIG. 4, the first semiconductor layer 10 further includes a second thin film portion 12. The second thin film portion 12 is arranged with the first thin film portion 11 in the X-Y plane (the plane perpendicular to the stacking direction). The second thin film portion 12 extends along the second direction D2 (the Y-axis direction). The second thin film portion 12 has a third thickness d3 (a thickness in the stacking direction). The third thickness d3 is thinner than the second thickness d2. The third thickness d3 is, for example, the same as the first thickness d1. The third thickness d3 may be different from the first thickness d1.

A portion of the portion of the first semiconductor layer 10 where the recess 10d is provided corresponds to the second thin film portion 12. The portion of the recess 10d is provided along the extension direction (the second direction D2) of the second thin film portion 12.

As shown in FIG. 4, a portion of the fine wire portion 46 is disposed along the second thin film portion 12. For example, the second elongated electrode 42 is disposed at the bottom surface (e.g., a second bottom surface 10q) of the recess 10d corresponding to the second thin film portion 12.

The thin film portion (the first thin film portion 11, the second thin film portion, etc.), the recess 10d, and the fine wire portion 46 (the first elongated electrode 41, the second elongated electrode 42, etc.) are disposed to cause, for example, the current density distribution in the device surface to be uniform. As recited above, the first elongated electrode 41 extends along the first direction D1. The second elongated electrode 42 extends along the second direction D2 which intersects the first direction D1.

On the other hand, the semiconductor layer (e.g., the first semiconductor layer 10) includes a crystal having a cleavage plane. In the embodiment, the first direction D1 is set to intersect (to be non-parallel to) the cleavage plane. Thereby, cracks can be suppressed. The cracks can be suppressed further by setting the second direction D2 to intersect (to be non-parallel to) the cleavage plane.

Figure 5:
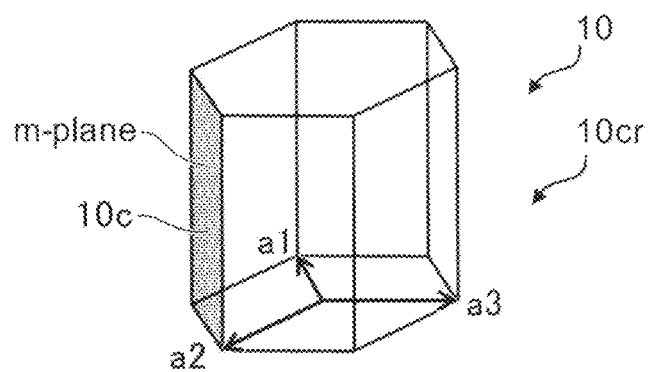
FIG. 5 is a schematic view showing the cleavage plane of the semiconductor layer.

FIG. 5 is a schematic view showing the cleavage plane of the semiconductor layer.

FIG. 5 shows the case where a crystal 10cr of the semiconductor layer (e.g., the first semiconductor layer 10) is a wurtzite-type crystal having an m-plane.

As shown in FIG. 5, the m-plane of the wurtzite-type crystal corresponds to a cleavage plane 10c. The cleavage plane 10c is cleavable. The crystal 10cr can be cleaved at the cleavage plane 10c.

In the example, the cleavage plane 10c of the first semiconductor layer 10 (the crystal 10cr) is parallel to the [11-20] direction. Because the crystal 10cr is rotationally symmetric, the cleavage plane 10c is parallel to one selected from three a-axes (the a1-axis, the a2-axis, and the a3-axis).

Figures 6A, 6B:
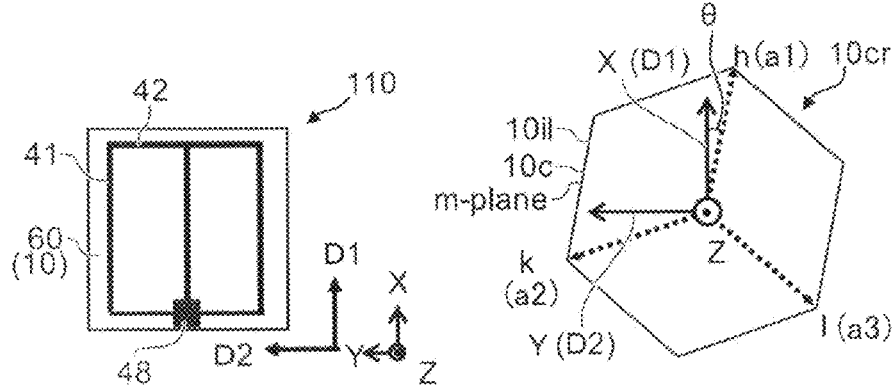
FIG. 6A and FIG. 6B are schematic views showing the semiconductor light emitting device according to the first embodiment.

FIG. 6A and FIG. 6B are schematic views showing the semiconductor light emitting device according to the first embodiment.

FIG. 6A is a plan view of the semiconductor light emitting device 110 and shows the first direction D1 and the second direction D2. In FIG. 6A, the extension direction of the first elongated electrode 41 corresponds to the extension direction of the first thin film portion 11; and the extension direction of the second elongated electrode 42 corresponds to the extension direction of the second thin film portion 12. FIG. 6B shows the relationship between the first direction D1 and the cleavage plane 10c.

In the example as shown in FIG. 6A, the first direction D1 is parallel to the X-axis direction; and the second direction D2 is parallel to the Y-axis direction.

In the example as shown in FIG. 6B, the c-axis (the [0001] direction or the [000-1] direction) is parallel to the Z-axis direction. In the embodiment, the first direction D1 intersects the cleavage plane 10c. For example, an angle θ between the first direction D1 and the cleavage plane 10c is set to be not less than 3 degrees and not more than 57 degrees.

In the case where the second elongated electrode 42 is provided, the angle between the second direction D2 and the cleavage plane 10c is, for example, more than 63 degrees and not more than 87 degrees.

Residual stress due to, for example, the manufacturing processes, etc., is stored inside the first semiconductor layer 10. The first thin film portion 11 and the second thin film portion 12 are provided in the first semiconductor layer 10. The stress resistance of the thin film portions is lower than the stress resistance of the thick film portion 15. In the case where the extension direction of the thin film portion (e.g., at least one selected from the first direction D1 and the second direction D2) is parallel to the cleavage plane 10c, cracks having the thin film portion as a starting point occur easily. The occurrence of the cracks can be suppressed by the angle between the cleavage plane 10c and the extension direction of the thin film portion having an intersection.

In the embodiment, cracks can be effectively suppressed by, for example, the angle θ between the first direction D1 and the cleavage plane 10c being not less than 3 degrees.

In the case where the crystal 10cr of the semiconductor layer is a wurtzite-type crystal, the cleavage plane 10c exists at three orientations. The angle between the cleavage planes 10c is 60 degrees (or 120 degrees). In the case where the angle θ is 60 degrees, one cleavage plane that is different from the cleavage plane 10c of interest (e.g., the m-plane) is parallel to the first direction D1. By setting the angle θ to be 57 degrees or less, the one cleavage plane that is different from the cleavage plane 10c of interest (e.g., the m-plane) also intersects the first direction D1.

In the specification of the application, the angle θ between the first direction D1 and the cleavage plane 10c is represented as an angle that is less than 90 degrees and not less than 0 degrees. The angle θ may be the angle between the first direction D1 and the cleavage plane 10c using the first direction D1 as a reference or may be the angle between the first direction D1 and the cleavage plane 10c using the cleavage plane 10c as a reference. The angle θ does not include the rotation direction.

Thus, the crystal 10cr of the first semiconductor layer 10 is, for example, a wurtzite-type crystal having an m-plane. As shown in FIG. 6B, the angle θ recited above is the angle between the first direction D1 and an intersection line 10il where the m-plane intersects the X-Y plane (the plane perpendicular to the stacking direction). The angle between the intersection line 10il and the first direction D1 is set to be not less than 3 degrees and not more than 57 degrees.

In the embodiment, for example, the c-axis of the wurtzite-type crystal is along the Z-axis direction (the stacking direction). For example, the angle (the absolute value of the angle) between the c-axis and the Z-axis direction is not more than 3 degrees. In the embodiment as described below, the angle between the c-axis and the Z-axis direction is arbitrary.

For example, the second elongated electrode 42 is provided as in the example; and the angle θ between the first direction D1 and the cleavage plane 10c is set to be not less than 3 degrees and not more than 27 degrees in the case where the angle between the first direction D1 and the second direction D2 is not less than 88 degrees and not more than 92 degrees. Thereby, the second direction D2 also intersects the cleavage plane 10c. For example, the angle between the second direction D2 and the cleavage plane 10c also is not less than 3 degrees and not more than 27 degrees.

Examples of differences of the occurrence of cracks when the cleavage plane 10c and the extension direction of the thin film portion are changed will now be described.

First to fourth samples described below have configurations similar to the semiconductor light emitting device 110 described in regard to FIG. 1 to FIG. 4. However, the angle θ between the first direction D1 and the cleavage plane 10c is different between the samples. Also, the chip size is different between the samples.

In the samples, the first semiconductor layer 10 is a GaN layer. The first elongated electrode 41 and the second elongated electrode 42 are provided in the fine wire portion 46. The first elongated electrode 41 (the first thin film portion 11) extends in the first direction D1; and the second elongated electrode 42 (the second thin film portion 12) extends in the second direction D2. The first direction D1 and the second direction D2 are orthogonal to each other.

For the first sample and the third sample, the chip configuration is a square having sides that are 0.75 mm in length. For the second sample and the fourth sample, the chip configuration is a square having sides that are 1 mm in length.

In the first sample and the second sample, the first direction D1 intersects the cleavage plane 10c. Specifically, the angle θ between the first direction D1 and the cleavage plane 10c is 15 degrees. The angle between the second direction D2 and the cleavage plane 10c is 75 degrees.

In the third sample and the fourth sample, the first direction D1 is parallel to the cleavage plane 10c. The angle θ between the first direction D1 and the cleavage plane 10c is substantially 0 degrees.

The samples are formed by changing the orientation of the mask when patterning the stacked body formed by crystal growth. Other than the orientation of the mask, the conditions are the same between the samples. In the experiment, conditions for which stress occurs relatively easily in the stacked body are employed to cause the difference between the occurrence of the cracks to be distinct.

Figure 7:
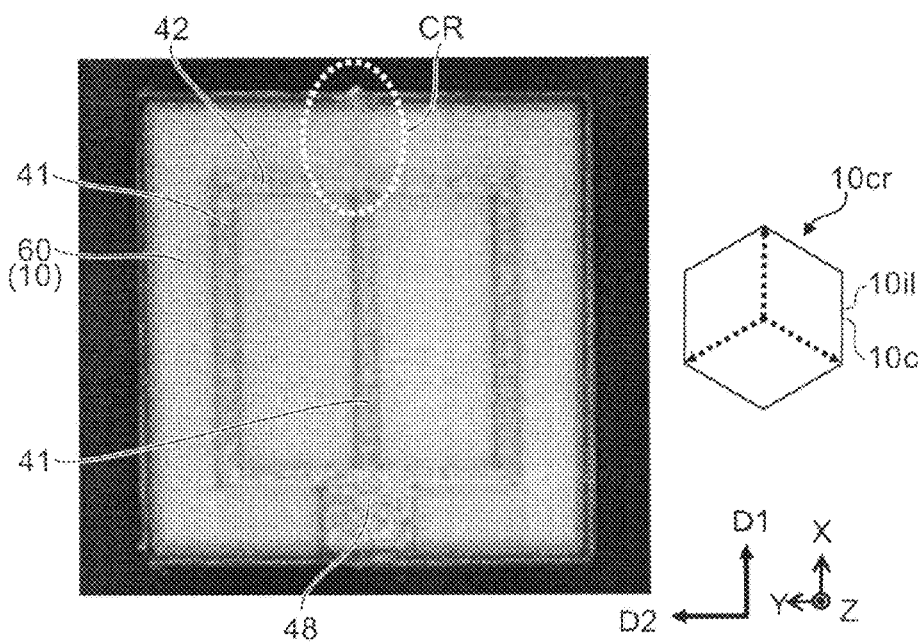
FIG. 7 is a micrograph showing the semiconductor light emitting device.

FIG. 7 is a micrograph showing the semiconductor light emitting device.

FIG. 7 is a micrograph of the third sample.

As shown in FIG. 7, a crack CR is observed in the third sample. The crack is along the first direction D1. In the third sample, the first direction D1 is parallel to the cleavage plane 10c; and the crack CR occurs along the cleavage plane 10c.

For multiple samples that were made, cracks were observed in all of the samples for the third sample (having sides of 0.75 mm) and the fourth sample (having sides of 1 mm).

On the other hand, for the first sample (having sides of 0.75 mm), the crack CR was not observed in 41% of the multiple samples. For the second sample (having sides of 1 mm) as well, the crack CR was not observed in about 10% of the multiple samples.

Thus, the occurrence rate of the cracks CR can be reduced greatly by setting the first direction D1 to intersect the cleavage plane 10c.

According to the embodiment, a semiconductor light emitting device in which cracks are suppressed can be provided.

FIG. 8A to FIG. 8I are schematic plan views showing other semiconductor light emitting devices according to the first embodiment.

These drawings show patterns of the first elongated electrode 41 and the second elongated electrode 42.

In semiconductor light emitting devices 111a to 111i according to the embodiment as shown in FIG. 8A to FIG. 8I, the extension direction (the first direction D1) of the first elongated electrode 41 is parallel to the X-axis direction; and the extension direction (the second direction D2) of the second elongated electrode 42 is parallel to the Y-axis direction.

Figures 8A, 8B, 8C:
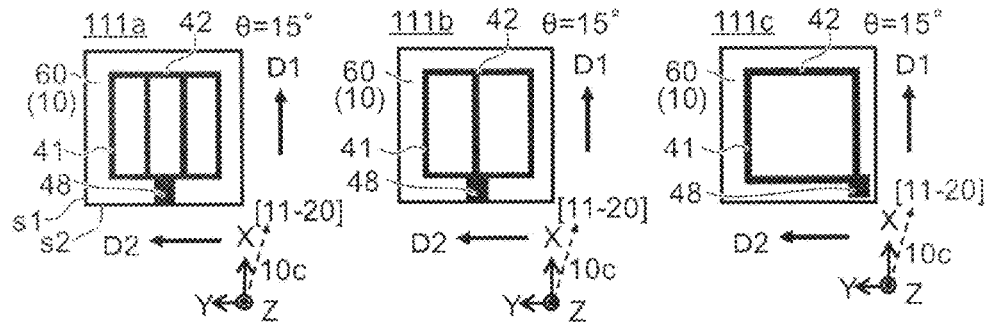
FIG. 8A to FIG. 8I are schematic plan views showing other semiconductor light emitting devices according to the first embodiment.
Figures 8D, 8E, 8F:
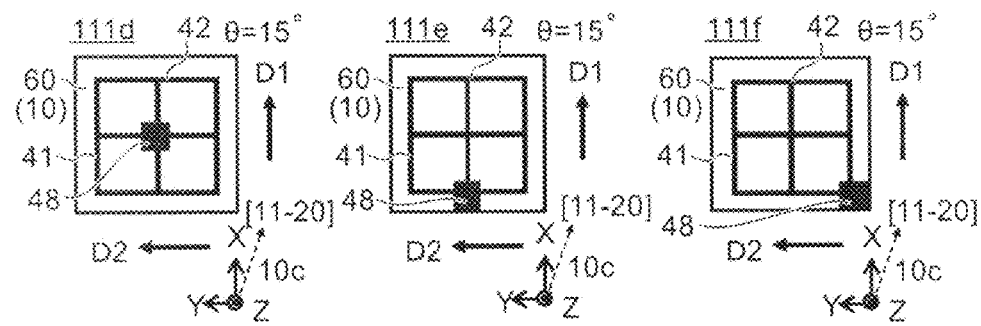
Figures 8G, 8H, 8I:
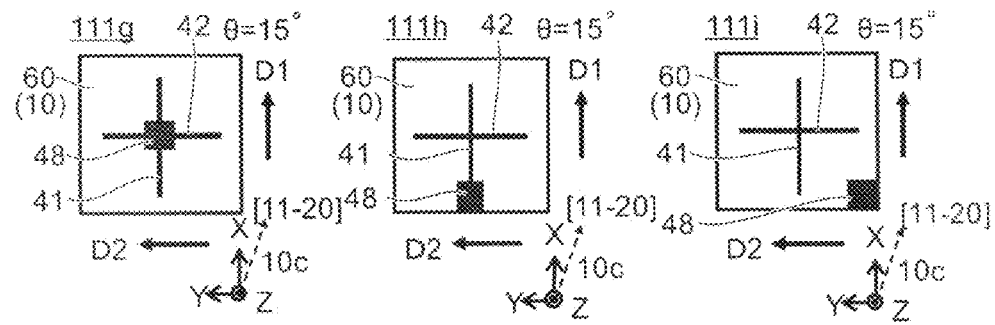

As shown in FIG. 8A, the first direction D1 is parallel to one side (a first side s1) of the exterior form of the device. The second direction D2 is parallel to one other side (a second side s2) of the exterior form of the device. The extension direction of the second side s2 intersects the extension direction of the first side s1. For easier viewing of the drawings, the reference numerals of the first side s1 and the second side s2 are not shown in FIG. 8B to FIG. 8I.

In the semiconductor light emitting devices 111a to 111i, the c-axis of the crystal 10cr is substantially parallel to the Z-axis direction. The angle θ between the first direction D1 and the cleavage plane 10c is not less than 3 degrees and not more than 57 degrees. Because the second elongated electrode 42 is provided in the examples, the angle θ is set to be not less than 3 degrees and not more than 27 degrees. The angle θ is, for example, 15 degrees.

In the semiconductor light emitting device 111a, the number of the first elongated electrodes 41 is four; and the number of the second elongated electrodes 42 is two.

In the semiconductor light emitting device 111b, the number of the first elongated electrodes 41 is three; and the number of the second elongated electrodes 42 is two.

In the semiconductor light emitting device 111c, the number of the first elongated electrodes 41 is two; and the number of the second elongated electrodes 42 is two.

In the semiconductor light emitting devices 111a and 111b, the pad portion 48 is disposed at the central portion of one side of the upper surface of the device. In the semiconductor light emitting device 111c, the pad portion 48 is disposed at one corner portion of the upper surface of the device.

In the semiconductor light emitting device 111d, the number of the first elongated electrodes 41 is three; and the number of the second elongated electrodes 42 is three. The pad portion 48 is disposed at the central portion of the upper surface of the device.

In the semiconductor light emitting device 111e, the number of the first elongated electrodes 41 is three; and the number of the second elongated electrodes 42 is three. The pad portion 48 is disposed at the central portion of one side of the upper surface of the device.

In the semiconductor light emitting device 111f, the number of the first elongated electrodes 41 is three; and the number of the second elongated electrodes 42 is three. The pad portion 48 is disposed at one corner portion of the upper surface of the device.

In the semiconductor light emitting devices 111a to 111f, a portion of the pattern of the elongated electrodes has a frame-like configuration.

In the semiconductor light emitting devices 111g to 111i, the number of the first elongated electrodes 41 is one; and the number of the second elongated electrodes 42 is one. The first elongated electrode 41 intersects the second elongated electrode 42 at the central portion of the upper surface of the device.

In the semiconductor light emitting device 111g, the pad portion 48 is disposed at the central portion of the upper surface of the device. In the semiconductor light emitting device 111h, the pad portion 48 is disposed at the central portion of one side of the upper surface of the device. In the semiconductor light emitting device 111i, the pad portion 48 is disposed at one corner portion of the upper surface of the device. In the semiconductor light emitting device 111i, the pad portion 48 is electrically connected to the first elongated electrode 41 and the second elongated electrode 42 by a not-shown interconnect.

In the semiconductor light emitting devices 111a to 111i as well, cracks are suppressed.

FIG. 9A to FIG. 9I are schematic plan views showing other semiconductor light emitting devices according to the first embodiment.

These drawings show patterns of the elongated electrodes (e.g., the first elongated electrode 41, the second elongated electrode 42, etc.).

Figures 9A, 9B, 9C:
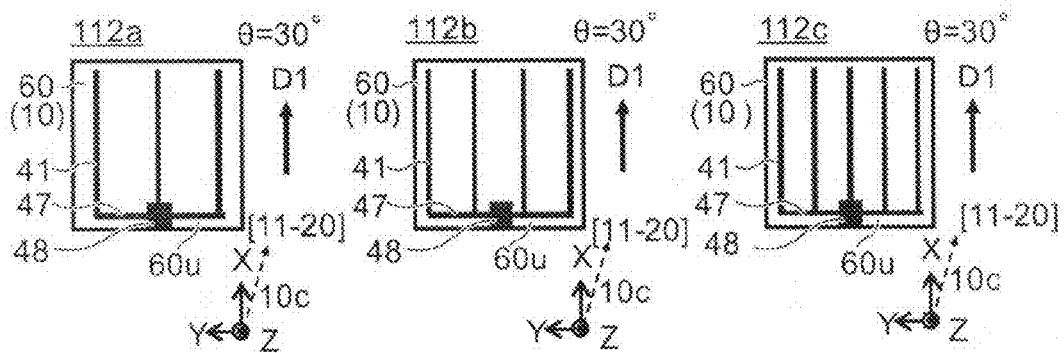
FIG. 9A to FIG. 9I are schematic plan views showing other semiconductor light emitting devices according to the first embodiment.

In semiconductor light emitting devices 112a to 112c according to the embodiment as shown in FIG. 9A to FIG. 9C, the first elongated electrode 41 is provided; and the second elongated electrode 42 is not provided. In other words, the second thin film portion is not provided. The pad portion 48 and the first elongated electrode 41 are electrically connected by an interconnect 47. The interconnect 47 is provided, for example, at the upper surface 60u of the low impurity concentration layer 60. The extension direction (the first direction D1) of the first elongated electrode 41 is parallel to the X-axis direction. The extension direction of the interconnect 47 is parallel to the Y-axis direction.

In the semiconductor light emitting devices 112a to 112c, the c-axis of the crystal 10cr is substantially parallel to the Z-axis direction. The angle θ between the first direction D1 and the cleavage plane 10c is not less than 3 degrees and not more than 57 degrees, e.g., 30 degrees.

In the semiconductor light emitting device 112a, the number of the first elongated electrodes 41 is three. In the semiconductor light emitting device 112b, the number of the first elongated electrodes 41 is four. In the semiconductor light emitting device 112c, the number of the first elongated electrodes 41 is five.

Figures 9D, 9E, 9F:
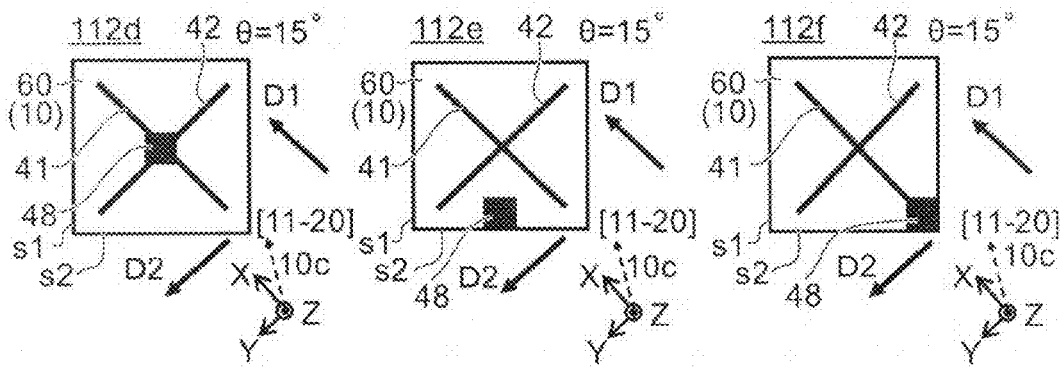

As shown in FIG. 9D to FIG. 9F, the first elongated electrode 41 and the second elongated electrode 42 are provided in semiconductor light emitting devices 112d to 112f according to the embodiment. The extension direction (the first direction D1) of the first elongated electrode 41 is parallel to the X-axis direction; and the extension direction (the second direction D2) of the second elongated electrode 42 is parallel to the Y-axis direction.

As shown in FIG. 9D to FIG. 9F, the first direction D1 intersects (e.g., has an angle of 45 degrees with respect to) one side (the first side s1) of the exterior form of the device. The second direction D2 intersects (e.g., has an angle of 45 degrees with respect to) one other side (the second side s2) of the exterior form of the device.

In the semiconductor light emitting devices 112d to 112f, the c-axis of the crystal 10cr is substantially parallel to the Z-axis direction. The angle θ between the first direction D1 and the cleavage plane 10c is not less than 3 degrees and not more than 57 degrees. Because the second elongated electrode 42 is provided in the examples, the angle θ is set to be not less than 3 degrees and not more than 27 degrees. The angle θ is, for example, 15 degrees.

In the semiconductor light emitting devices 112d to 112f, the number of the first elongated electrodes 41 is one; and the number of the second elongated electrodes 42 is one. The first elongated electrode 41 intersects the second elongated electrode 42 at the central portion of the upper surface of the device.

In the semiconductor light emitting device 112d, the pad portion 48 is disposed at the central portion of the upper surface of the device. In the semiconductor light emitting device 112e, the pad portion 48 is disposed at the central portion of one side of the upper surface of the device. In the semiconductor light emitting device 112e, the pad portion 48 is electrically connected to the first elongated electrode 41 and the second elongated electrode 42 by a not-shown interconnect. In the semiconductor light emitting device 112f, the pad portion 48 is disposed at one corner portion of the upper surface of the device.

Figures 9G, 9H, 9I:
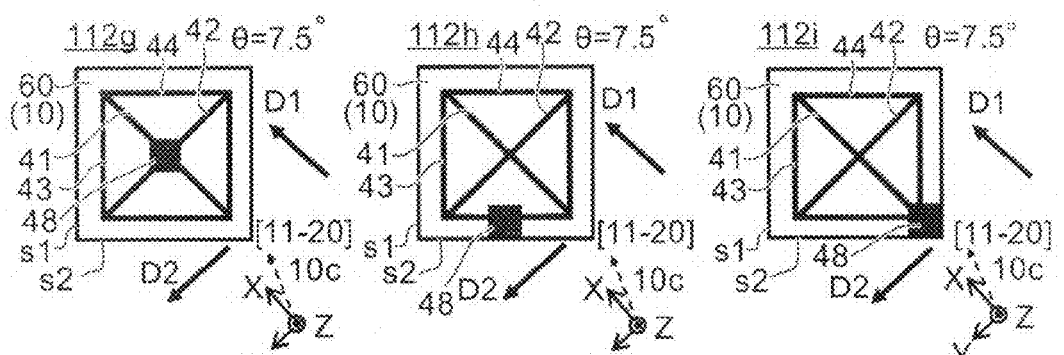
Figures 10A, 10B, 10C:
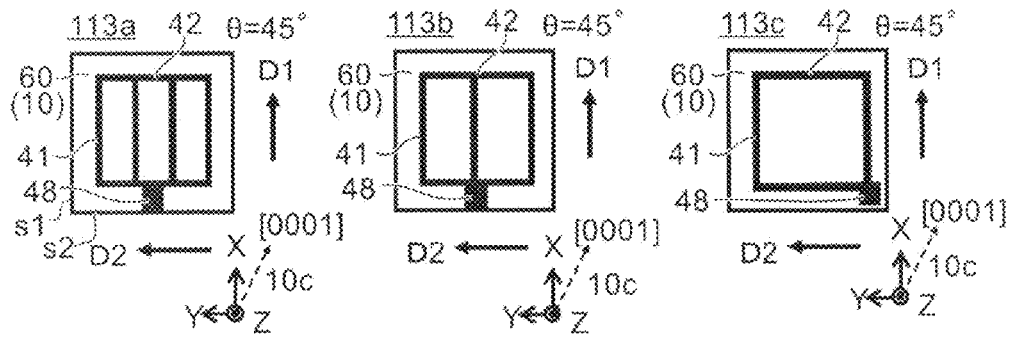
FIG. 10A to FIG. 10I are schematic plan views showing other semiconductor light emitting devices according to the first embodiment.
Figures 10D, 10E, 10F:
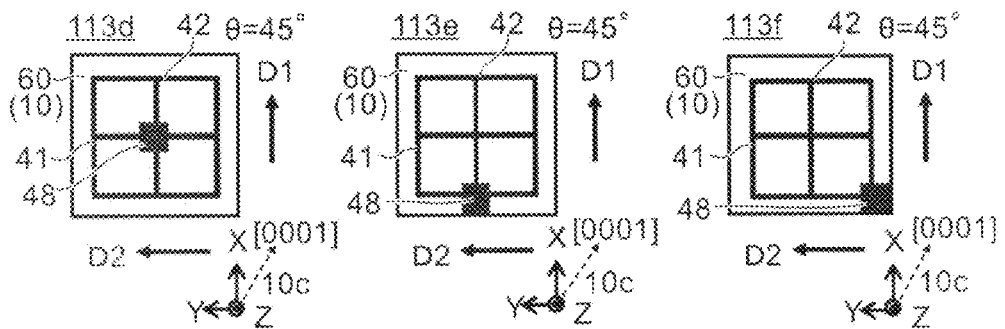
Figures 10G, 10H, 10I:
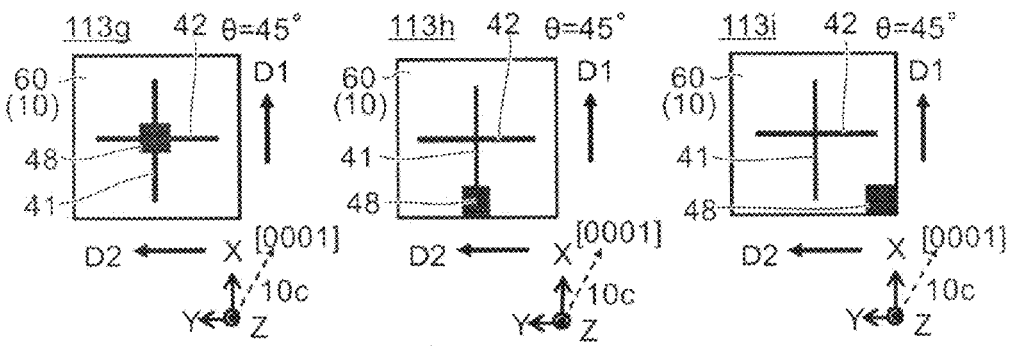
Figures 11A, 11B, 11C:
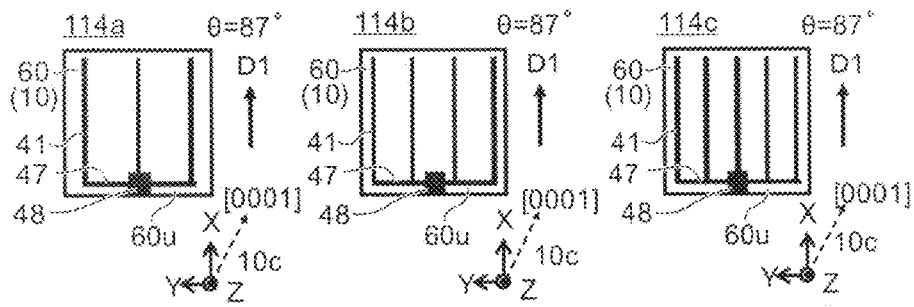
FIG. 11A to FIG. 11I are schematic plan views showing other semiconductor light emitting devices according to the first embodiment.
Figures 11D, 11E, 11F:
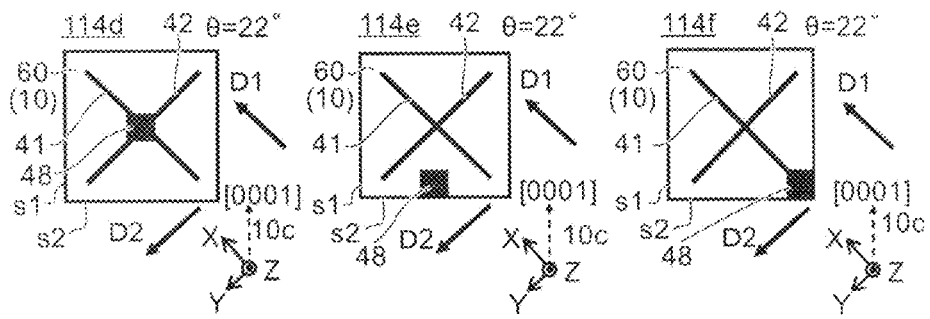
Figures 11G, 11H, 11I:
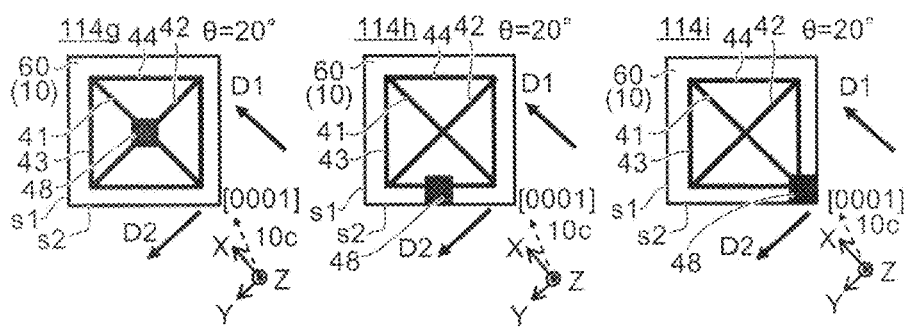

As shown in FIG. 9G to FIG. 9H, the first elongated electrode 41 and the second elongated electrode 42 are provided in semiconductor light emitting devices 112g to 112i according to the embodiment. Further, a third elongated electrode 43 is provided along one side (the first side s1) of the exterior form of the device; and a fourth elongated electrode 44 is provided along one other side (the second side s2) of the exterior form of the device. The extension direction of the second side s2 intersects the extension direction of the first side s1.

In the semiconductor light emitting devices 112g to 112i, the c-axis of the crystal 10cr is substantially parallel to the Z-axis direction. The angle θ between the first direction D1 and the cleavage plane 10c is not less than 3 degrees and not more than 57 degrees. Because the second elongated electrode 42, the third elongated electrode 43, and the fourth elongated electrode 44 are provided in the examples, the angle θ is set to be not less than 3 degrees and not more than 12 degrees. The angle θ is, for example, 7.5 degrees.

In the semiconductor light emitting devices 112g to 112i, the first elongated electrode 41 intersects the second elongated electrode 42 at the central portion of the upper surface of the device. In the semiconductor light emitting device 112g, the pad portion 48 is disposed at the central portion of the upper surface of the device. In the semiconductor light emitting device 112h, the pad portion 48 is disposed at the central portion of one side of the upper surface of the device. In the semiconductor light emitting device 112i, the pad portion 48 is disposed at one corner portion of the upper surface of the device.

In the semiconductor light emitting devices 112a to 112i as well, cracks are suppressed.

In the semiconductor light emitting devices 110, 111a to 111i, and 112a to 112i, the [11-20] direction is substantially perpendicular to the Z-axis direction. For example, the angle between the [11-20] direction and the Z-axis direction is not less than 88 degrees and not more than 92 degrees.

In the semiconductor light emitting devices 110, 111a to 111i, and 112a to 112i, for example, the first semiconductor layer 10 is a wurtzite-type crystal. At least one selected from the (0001) plane and the (000-1) plane of the wurtzite-type crystal is substantially perpendicular to the Z-axis direction (the stacking direction). The angle between the (0001) plane and the Z-axis direction is not less than 88 degrees and not more than 92 degrees. The angle between the first direction D1 and the [11-20] direction of the wurtzite-type crystal when projected onto the X-Y plane (the plane perpendicular to the stacking direction) is not less than 3 degrees and not more than 57 degrees. In the case where the second elongated electrode 42 (the second thin film portion 12) is provided, the angle is set to be not less than 3 degrees and not more than 27 degrees. In the case where the third elongated electrode 43 (and the fourth elongated electrode 44) are provided, the angle is set to be not less than 3 degrees and not more than 12 degrees. Thereby, cracks are effectively suppressed.

The plane or direction of the crystal is notated in the specification of the application by the symbol "-" (a bar) being in front of the numeral instead of being above the numeral.

In FIG. 8A to FIG. 8I and FIG. 9A to FIG. 9I, the [11-20] direction is parallel to the cleavage plane 10c. Also, the intersection line 10il (referring to FIG. 6B) where the m-plane intersects the X-Y plane (the plane perpendicular to the stacking direction) is parallel to the [11-20] direction.

In the semiconductor light emitting device according to the embodiment, the first semiconductor layer 10 may be a wurtzite-type crystal; and the (10-10) plane of the wurtzite-type crystal may be substantially perpendicular to the Z-axis direction. The angle between the (10-10) plane and the Z-axis direction is, for example, not less than 88 degrees and not more than 92 degrees. In such a case, the angle (corresponding to the angle θ) between the first direction D1 and the [0001] direction of the wurtzite-type crystal when projected onto the X-Y plane may be in a range that is not less than 3 degrees and not more than 27 degrees.

Or, in the semiconductor light emitting device according to the embodiment, the first semiconductor layer 10 may be a wurtzite-type crystal; and the (11-20) plane of the wurtzite-type crystal may be substantially perpendicular to the Z-axis direction. The angle between the (11-20) plane and the Z-axis direction is, for example, not less than 88 degrees and not more than 92 degrees. In such a case, the angle (corresponding to the angle θ) between the first direction D1 and the [0001] direction of the wurtzite-type crystal when projected onto the X-Y plane may be in a range that is not less than 3 degrees and not more than 27 degrees.

The range of the angle θ recited above can be enlarged in the case where the (10-10) plane or the (11-20) plane of the wurtzite-type crystal intersects (e.g., is substantially perpendicular to) the Z-axis direction. To simplify the description hereinbelow, first, an example in which the (10-10) plane or the (11-20) plane is substantially perpendicular to the Z-axis direction will be described.

FIG. 10A to FIG. 10I are schematic plan views showing other semiconductor light emitting devices according to the first embodiment.

These drawings show patterns of the first elongated electrode 41 and the second elongated electrode 42.

In semiconductor light emitting devices 113a to 113i according to the embodiment as shown in FIG. 10A to FIG. 10I, the patterns of the first elongated electrode 41 and the second elongated electrode 42 are the same as those of the semiconductor light emitting devices 111a to 111i, respectively.

In the semiconductor light emitting devices 113a to 113i, the crystal orientations are different from the crystal orientations of the semiconductor light emitting devices 111a to 111i, respectively.

In the semiconductor light emitting devices 113a to 113i, for example, the [0001] direction (or the [000-1] direction) is substantially perpendicular to the Z-axis direction. The angle between the Z-axis direction and the [0001] direction (or the [000-1] direction) is not less than 88 degrees and not more than 92 degrees.

For example, the first semiconductor layer 10 is a wurtzite-type crystal. At least one selected from the angle between the Z-axis direction and the (10-10) plane of the wurtzite-type crystal and the angle between the Z-axis direction and the (11-20) plane of the wurtzite-type crystal is not less than 88 degrees and not more than 92 degrees.

In the semiconductor light emitting devices 113a to 113i, the angle θ between the first direction D1 and the cleavage plane 10c may be in a range not less than 3 degrees and not more than 87 degrees. In the example, the angle θ is 45 degrees in the semiconductor light emitting devices 113a to 113i. Thereby, cracks are suppressed.

In the semiconductor light emitting devices 113a to 113i, the angle (corresponding to the angle θ) between the first direction D1 and the [0001] direction of the wurtzite-type crystal when projected onto the X-Y plane (the plane perpendicular to the Z-axis direction) is set to be not less than 3 degrees and not more than 87 degrees. Thereby, cracks are suppressed.

FIG. 11A to FIG. 11I are schematic plan views showing other semiconductor light emitting devices according to the first embodiment.

These drawings show patterns of the elongated electrodes (e.g., the first elongated electrode 41, the second elongated electrode 42, etc.).

In semiconductor light emitting devices 114a to 114i according to the embodiment as shown in FIG. 11A to FIG. 11I, the patterns of the elongated electrodes (the first elongated electrode 41, the second elongated electrode 42, etc.) are the same as those of the semiconductor light emitting devices 112a to 112i, respectively.

In the semiconductor light emitting devices 114a to 114i, the crystal orientations are different from the crystal orientations of the semiconductor light emitting devices 112a to 112i, respectively.

In the semiconductor light emitting devices 114a to 114i, the angle between the Z-axis direction and the [0001] direction (or the [000-1] direction) is not less than 88 degrees and not more than 92 degrees.

At least one selected from the angle between the Z-axis direction and the (10-10) plane of the wurtzite-type crystal and the angle between the Z-axis direction and the (11-20) plane of the wurtzite-type crystal is not less than 88 degrees and not more than 92 degrees.

The second elongated electrode 42 is not provided in the semiconductor light emitting devices 114a to 114c. In other words, the second thin film portion 12 is not provided. In the semiconductor light emitting devices 114a to 114c, the angle θ between the cleavage plane 10c and the first direction D1 may be in a range not less than 3 degrees and not more than 87 degrees. In the example, the angle θ is 87 degrees.

In the semiconductor light emitting devices 114d to 114f, the second elongated electrode 42 is provided in addition to the first elongated electrode 41. In these examples, the angle θ between the cleavage plane 10c and the first direction D1 is set to be 22 degrees. In these examples, the angle θ is set to be not less than 3 degrees and not more than 42 degrees.

The first to fourth elongated electrodes 41 to 44 are provided in the semiconductor light emitting devices 114g to 114i. In these examples, the angle θ is set to be not less than 3 degrees and not more than 20 degrees. In the example, the angle θ is 20 degrees.

In the semiconductor light emitting devices 114a to 114i as well, cracks are suppressed.

In the embodiment recited above, the case where the (10-10) plane or the (11-20) plane of the wurtzite-type crystal is substantially perpendicular to the Z-axis direction is described. In such a case, the angle between the Z-axis direction and the (10-10) plane or the (11-20) plane is, for example, not more than 3 degrees. In the embodiment, the angle may be more than 3 degrees.

In other words, in the embodiment, the (10-10) plane or the (11-20) plane may be tilted with respect to the Z-axis direction. For example, the angle between the Z-axis direction and the (10-10) plane or the (11-20) plane may be in a range not less than 15 degrees and not more than 90 degrees. In such a range of angles, the plane is a semi-polar plane. In such a case as well, the angle between the first direction D1 and the [0001] direction of the wurtzite-type crystal when projected onto the plane (the X-Y plane) perpendicular to the stacking direction is set to be not less than 3 degrees and not more than 27 degrees. Thereby, a semiconductor light emitting device in which cracks are suppressed can be provided. The case where the (10-10) plane or the (11-20) plane is tilted with respect to the Z-axis direction is applicable also to the examples shown in FIG. 10A to FIG. 10I and FIG. 11A to FIG. 11I.

In the case where the (10-10) plane or the (11-20) plane intersects the Z-axis direction, for example, the [0001] direction when projected onto the X-Y plane is parallel to the arrow illustrating the [0001] direction of the examples shown in FIG. 10A to FIG. 10I and FIG. 11A to FIG. 11I. In such a case as well, the intersection line 10il (referring to FIGS. 6A and 6B) where the m-plane intersects the X-Y plane (the plane perpendicular to the stacking direction) is parallel to the [0001] direction. Also, the cleavage plane 10c of the case where the (10-10) plane or the (11-20) plane intersects the Z-axis direction is parallel to the cleavage plane 10c shown in FIG. 10A to FIG. 10I and FIG. 11A to FIG. 11I.

Thus, in the embodiment, the (10-10) plane or the (11-20) plane may intersect (be perpendicular to or tilted with respect to) the Z-axis direction. For example, the angle between the Z-axis direction and the (10-10) plane or the (11-20) plane may be in a range not less than 0 degrees and not more than 90 degrees. The (10-10) plane of the wurtzite-type crystal intersects the stacking direction. The (11-20) plane of the wurtzite-type crystal intersects the stacking direction.

Thus, in the case where the (10-10) plane or the (11-20) plane intersects the Z-axis direction as well, in the embodiment, the angle between the first direction D1 and the [0001] direction of the wurtzite-type crystal when projected onto the plane (the X-Y plane) perpendicular to the stacking direction is set to be not less than 3 degrees and not more than 27 degrees. Thereby, a semiconductor light emitting device in which cracks are suppressed can be provided.

In the embodiment, the range of the angle θ may be changed according to the relative relationship between the axis of the crystal and the Z-axis direction such that the first direction D1 intersects the cleavage plane 10c.

As shown in FIG. 8A to FIG. 8I and FIG. 9A to FIG. 9I, it is easy to obtain a high-quality crystal in the case where the c-axis of the wurtzite-type crystal is substantially parallel to the stacking direction (in the case where the absolute value of the angle between the c-axis of the wurtzite-type crystal and the stacking direction is not more than 3 degrees).

As shown in FIG. 10A to FIG. 10I and FIG. 11A to FIG. 11I, in the case where the (10-10) plane or the (11-20) plane of the wurtzite-type crystal is perpendicular to the stacking direction, for example, it is difficult for the internal electric field to affect the light emitting layer 30; and as a result, it is easy to obtain a high luminous efficiency. In the case where the (10-10) plane or the (11-20) plane is tilted with respect to the stacking direction, it is easy to obtain a high-quality crystal layer; and simultaneously, it is easy to suppress the internal electric field.

In the semiconductor light emitting device according to the embodiment, in the case where the substrate 70 is provided, the substrate 70 is bonded to the semiconductor layer via, for example, an intermediate conductive layer, etc. In such a case, the electrode layer 50 is disposed between the second semiconductor layer 20 and the substrate 70. In the case where the substrate 70 is a crystal, the crystal orientation of the substrate 70 is different from the crystal orientation of the first semiconductor layer 10 (i.e., the crystal 10cr). Conversely, in the case where the first semiconductor layer 10 is epitaxially grown on the substrate, the crystal orientation of the first semiconductor layer 10 is aligned with the crystal orientation of the substrate.

There are configurations to increase the light extraction efficiency from the side surface of the semiconductor light emitting device by causing the side surface of the semiconductor light emitting device to be an uneven surface. Further, there are methods for forming an unevenness in the side surface by forming multiple semiconductor light emitting devices on a monocrystalline substrate and by the side surface of the semiconductor light emitting device being different from the cleavage plane of the monocrystalline substrate when separating the semiconductor devices by dividing the monocrystalline substrate. In such a method, the side surface of the semiconductor light emitting device (i.e., the side of the exterior form of the device) intersects the cleavage plane of the monocrystalline substrate. In the example, the cleavage plane of the monocrystalline substrate is parallel to the cleavage plane of the semiconductor layer. In other words, the crystal orientation of the semiconductor layer is aligned with the crystal orientation of the monocrystalline substrate.

Conversely, in the semiconductor light emitting device according to the embodiment, in the case where the substrate 70 is a crystal, the crystal orientation of the substrate 70 does not match the crystal orientation of the first semiconductor layer 10 (i.e., the crystal 10cr).

In the embodiment, for example, the first semiconductor layer 10 includes a nitride semiconductor; the second semiconductor layer 20 includes a nitride semiconductor; and the light emitting layer 30 includes a nitride semiconductor. The crystal orientation of the light emitting layer 30 is the same as the crystal orientation of the first semiconductor layer 10; and the crystal orientation of the second semiconductor layer 20 is the same as the crystal orientation of the first semiconductor layer 10.

In the embodiment, the state of the orientation of the crystal (the direction and plane of the crystal) of the semiconductor layer can be determined by, for example, X-ray diffraction analysis, etc. In the case where the substrate 70 is a crystal, the state of the orientation of the crystal can be determined similarly by, for example, X-ray diffraction analysis, etc.

An example of the configuration of the semiconductor light emitting device according to the embodiment will now be described further.

Figure 12:
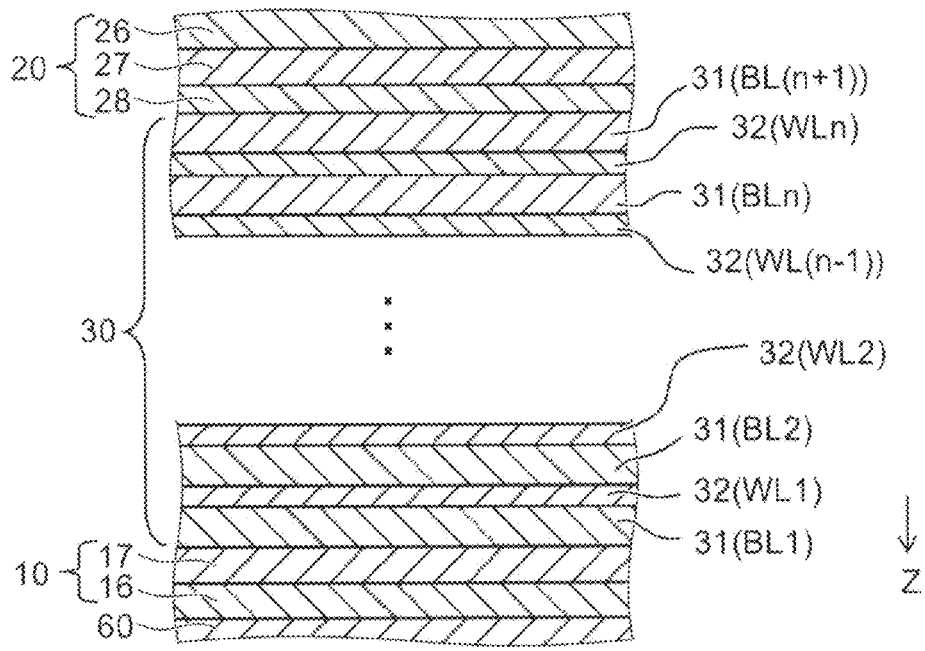
FIG. 12 is a schematic cross-sectional view showing the semiconductor light emitting device according to the first embodiment.

FIG. 12 is a schematic cross-sectional view showing the semiconductor light emitting device according to the first embodiment.

FIG. 12 shows an example of the configuration of the first semiconductor layer 10, the light emitting layer 30, and the second semiconductor layer 20. The light emitting layer 30 is disposed between the first semiconductor layer 10 and the second semiconductor layer 20.

The first semiconductor layer 10 includes, for example, a first n-side layer 16 and a second n-side layer 17. The second n-side layer 17 is disposed between the light emitting layer 30 and the first n-side layer 16. The first n-side layer 16 is, for example, a contact layer. The second n-side layer 17 is, for example, a clad layer. The concentration of the n-type impurity of the second n-side layer 17 is higher than the concentration of the n-type impurity of the first n-side layer 16. For example, Si is used as the n-type impurity. The first n-side layer 16 includes, for example, n-type GaN. The second n-side layer 17 includes, for example, n-type GaN. The thickness of the first semiconductor layer 10 is, for example, not less than 1 μm and not more than 6 μm.

The light emitting layer 30 includes multiple barrier layers 31, and a well layer 32 provided between the multiple barrier layers 31. For example, the multiple barrier layers 31 and the multiple well layers 32 are stacked alternately along the Z-axis direction.

The well layer 32 includes, for example, $In_{x0}Ga_{1-x0}N$ (0<x0<1). The barrier layer 31 includes, for example, GaN. In the case where InGaN is used as the barrier layer 31, the In composition ratio of the barrier layer 31 is lower than the In composition ratio of the well layer 32. The bandgap energy of the barrier layer 31 is greater than the bandgap energy of the well layer 32.

The light emitting layer 30 has, for example, a single quantum well (SQW) configuration. In such a case, the light emitting layer 30 includes two barrier layers 31, and a well layer 32 provided between the barrier layers 31. Or, the light emitting layer 30 may have, for example, a multiple quantum well (MQW) configuration. In such a case, the light emitting layer 30 includes three or more barrier layers 31, and the well layers 32 provided respectively in the spaces between the barrier layers 31.

As shown in FIG. 12, the light emitting layer 30 includes, for example, n+1 barrier layers 31 and n well layers 32 (n being an integer not less than 2). The (i+1)th barrier layer BL(i+1) is disposed between the ith barrier layer BLi and the second semiconductor layer 20 (i being an integer not less than 1 and not more than n−1). The (i+1)th well layer WL(i+1) is disposed between the nth well layer WLn and the second semiconductor layer 20. The first barrier layer BL1 is provided between the first semiconductor layer 10 and the first well layer WL1. The nth well layer WLn is provided between the nth barrier layer BLn and the (n+1)th barrier layer BL(n+1). The (n+1)th barrier layer BL(n+1) is provided between the nth well layer WLn and the second semiconductor layer 20. The (n+1)th barrier layer BL(n+1) may be omitted. In such a case, the nth well layer WLn contacts a layer that is used to form a portion of the second semiconductor layer 20; and the layer functions as the (n+1)th barrier layer BL(n+1).

The second semiconductor layer 20 includes, for example, a first p-side layer 26, a second p-side layer 27, and a third p-side layer 28. The second p-side layer 27 is disposed between the first p-side layer 26 and the light emitting layer 30. The third p-side layer 28 is disposed between the second p-side layer 27 and the light emitting layer 30.

The third p-side layer 28 includes, for example, AlGaN. At least a portion of the third p-side layer 28 may be doped with a p-type impurity. The second p-side layer 27 includes, for example, p-type GaN. The first p-side layer 26 includes, for example, p-type GaN. The concentration of the p-type impurity of the first p-side layer 26 is higher than the concentration of the p-type impurity of the second p-side layer 27. The first p-side layer 26 is, for example, a p-side contact layer. For example, Mg is used as the p-type impurity.

In the embodiment, the growth substrate may include, for example, silicon (Si), $SiO_2$, quartz, sapphire, GaN, SiC, GaAs, etc. The plane orientation of the growth substrate is arbitrary.

A buffer layer is formed on the growth substrate. The buffer layer is used to form at least a portion of the low impurity concentration layer 60. The first semiconductor layer 10, the light emitting layer 30, and the second semiconductor layer 20 are epitaxially grown on the buffer layer. The methods for growing the films may include, for example, metal-organic chemical vapor deposition (MOCVD), metal-organic vapor phase epitaxy, etc.

The buffer layer includes at least one selected from AlN, AlGaN, and GaN. The buffer layer may include a stacked film of multiple layers having different compositions. The low impurity concentration layer 60 includes at least one selected from AlN, AlGaN, and GaN. The low impurity concentration layer 60 may include a stacked film of multiple layers having different compositions. The thickness of the low impurity concentration layer 60 is, for example, not less than 0.5 μm and not more than 5 μm.

The electrode layer 50 is reflective to, for example, the light emitted from the light emitting layer 30. The portion of the electrode layer 50 on the side opposing the second semiconductor layer 20 includes, for example, Ag, a Ag alloy, Al, Au, or Rh.

It is favorable for the portion of the fine wire portion 46 (e.g., the first elongated electrode 41, the second elongated electrode 42, etc.) on the side opposing the first semiconductor layer 10 to include, for example, a metal that is highly reflective. For example, at least one selected from Ag, a Ag alloy, Al, Au, and Rh is used as the metal that is highly reflective.

The first intermediate conductive layer 71 is, for example, a bonding metal layer. The first intermediate conductive layer 71 includes, for example, Ti or a Ti alloy. The second intermediate conductive layer 72 is a bonding metal layer. The second intermediate conductive layer 72 may include, for example, a AuSn alloy, etc.

The peak wavelength of the light emitted from the light emitting layer 30 is, for example, not less than 370 nanometers (nm) and not more than 700 nm. The light is emitted to the outside mainly from the upper surface side (e.g., the second major surface 10b side of the first semiconductor layer 10) of the semiconductor light emitting device 110.

As described above, the thick film portion 15 and the thin film portion (the first thin film portion 11, the second thin film portion 12, etc.) are formed by providing the recess 10d (e.g., a trench) in the first semiconductor layer 10. The depth of the recess 10d is, for example, less than 95% and not less than 5% of the thickness (the second thickness d2) of the thick film portion 15 of the first semiconductor layer 10. The depth of the recess 10d corresponds to the absolute value of the difference between the second thickness d2 and the first thickness d1. The depth of the recess 10d corresponds to the absolute value of the difference between the second thickness d2 and the third thickness d3.

For example, in the case where the low impurity concentration layer 60 is provided, the recess 10d is made by making a trench from the surface of the low impurity concentration layer 60 to reach the first semiconductor layer 10. Then, the elongated electrodes (the first elongated electrode 41, etc.) are formed on the bottom surface (the first bottom surface 10p, etc.) of the recess 10d. To enlarge the process window, it is favorable to make the trench to sufficiently reach the first semiconductor layer 10. To this end, it is favorable for the depth of the recess 10d corresponding to the trench to be set to be not less than 5% of the second thickness d2. It is more favorable for the depth of the recess 10d to be set to be not less than 10% of the second thickness d2. The process window can be enlarged further by the depth of the recess 10d being set to be not less than 15% of the second thickness d2.

In the case where the depth of the recess 10d is 5% or more of the thickness (the second thickness d2) of the thick film portion 15, for example, cracks occur easily. Cracks occur more easily in the case where the depth of the recess 10d is 10% or more of the second thickness d2. Even in such cases, cracks can be suppressed by the extension direction of the thin film portion (e.g., the first direction D1) intersecting the cleavage plane 10c.

On the other hand, in the case where the depth of the recess 10d is designed to be not less than 95% of the second thickness d2, the trench that is made undesirably reaches the light emitting layer 30 easily due to, for example, fluctuation of the manufacturing, etc. Even in the case where the depth of the recess 10d is 90% of the second thickness d2, there are cases where the manufacturing yield decreases. Therefore, it is favorable for the depth of the recess 10d to be set to be less than 95% of the second thickness d2. It is more favorable for the depth of the recess 10d to be set to be less than 90% of the second thickness d2.

In the case where the low impurity concentration layer 60 is provided, the length along the Z-axis direction between the upper surface 60u of the low impurity concentration layer 60 and the bottom surface (the first bottom surface 10p and the second bottom surface 10q) of the recess 10d is, for example, not less than 1 μm and not more than 5 μm. The Z-axis direction position of the upper surface 60u of the low impurity concentration layer 60 is the Z-axis direction position of a protrusion 60p of the unevenness 60dp.

It is favorable for the depth of the recess 10d to be not less than thickness of the low impurity concentration layer 60. The thickness of the low impurity concentration layer 60 is the distance along the Z-axis direction from the upper surface 60u of the low impurity concentration layer 60 to the interface (i.e., the first major surface 10a) between the low impurity concentration layer 60 and the first semiconductor layer 10. Thereby, a sufficiently wide process window is obtained.

In the embodiment, the lengths, thicknesses, widths, depths, etc., relating to the semiconductor layers, trenches, etc., can be obtained by, for example, a reflection electron microscope, etc.

Second Embodiment

Figure 13:
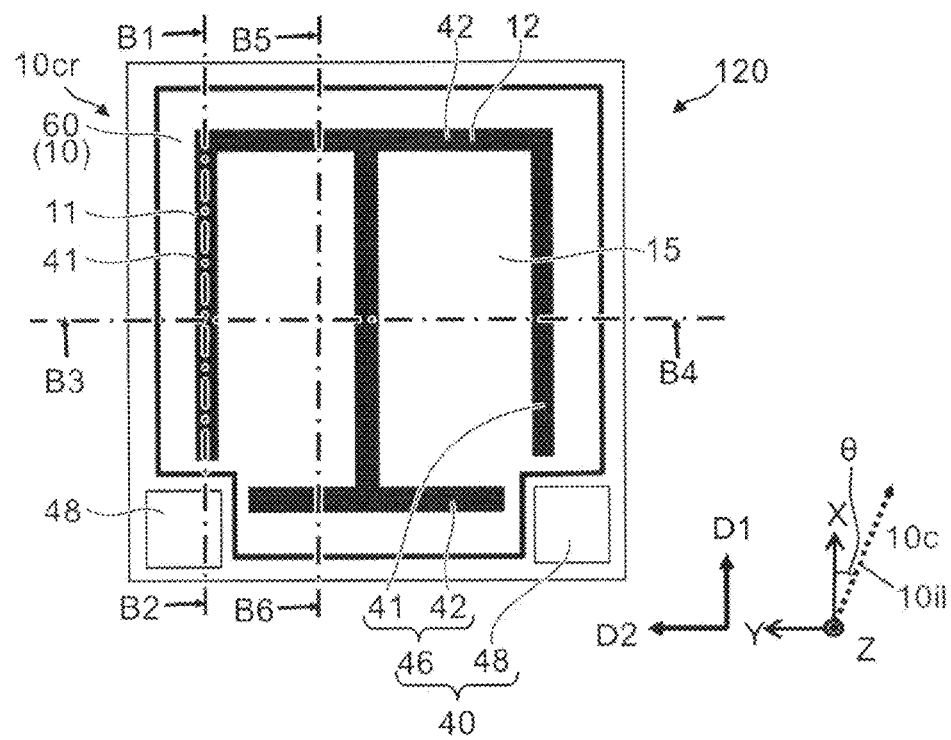
FIG. 13 is a schematic plan view showing a semiconductor light emitting device according to a second embodiment.

FIG. 13 is a schematic plan view showing a semiconductor light emitting device according to a second embodiment.

As shown in FIG. 13, the first semiconductor layer 10 and the first elongated electrode 41 are provided in the semiconductor light emitting device 120 according to the embodiment as well. The first semiconductor layer 10 includes the crystal 10cr having the cleavage plane 10c.

The first thin film portion 11 and the thick film portion 15 are provided in the first semiconductor layer 10. The first thin film portion 11 extends in the first direction D1. The first elongated electrode 41 extends in the first direction D1. In such a case as well, the first direction D1 is perpendicular to the stacking direction (the Z-axis direction) from the electrode layer 50 toward the first semiconductor layer 10. The first direction D1 is, for example, the X-axis direction.

In the example, the second thin film portion 12 also is provided; and the second thin film portion 12 extends in the second direction D2. The second elongated electrode 42 extends in the second direction D2. The second direction D2 is, for example, the Y-axis direction.

In the example as well, the first direction D1 intersects the cleavage plane 10c. The angle θ between the first direction D1 and the cleavage plane 10c is, for example, not less than 3 degrees and not more than 57 degrees. Because the second elongated electrode 42 is provided in the example, the angle θ between the first direction D1 and the cleavage plane 10c is set to be not less than 3 degrees and not more than 27 degrees.

For example, the crystal 10cr of the first semiconductor layer 10 is a wurtzite-type crystal having an m-plane. The angle (the angle θ) between the first direction D1 and the intersection line 10il where the m-plane intersects the X-Y plane (the plane perpendicular to the stacking direction) is not less than 3 degrees and not more than 27 degrees.

In the semiconductor light emitting device 120, the pad portion 48 does not overlap the first semiconductor layer 10 when projected onto the X-Y plane.

Figure 14:
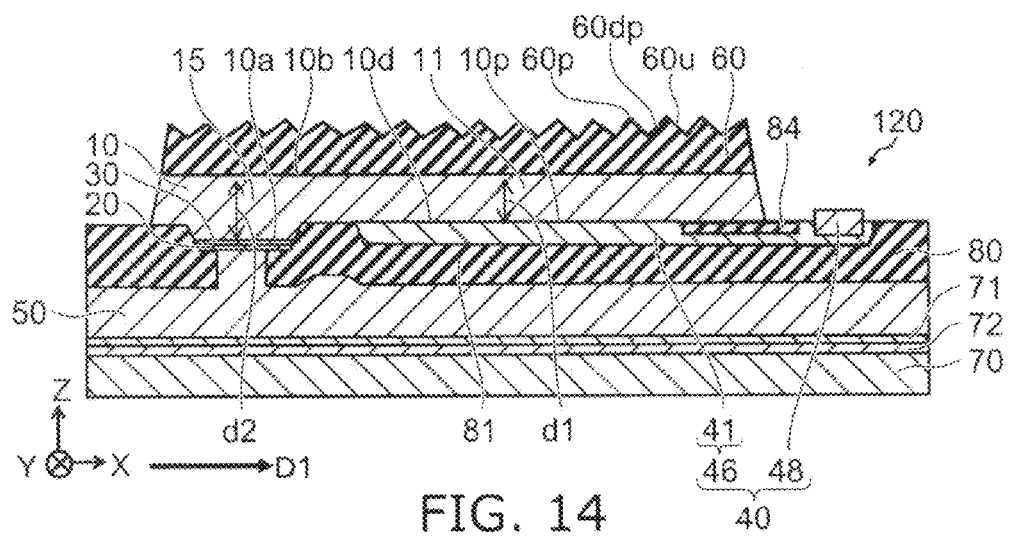
FIG. 14 is a schematic cross-sectional view showing the semiconductor light emitting device according to the second embodiment.
Figure 15:
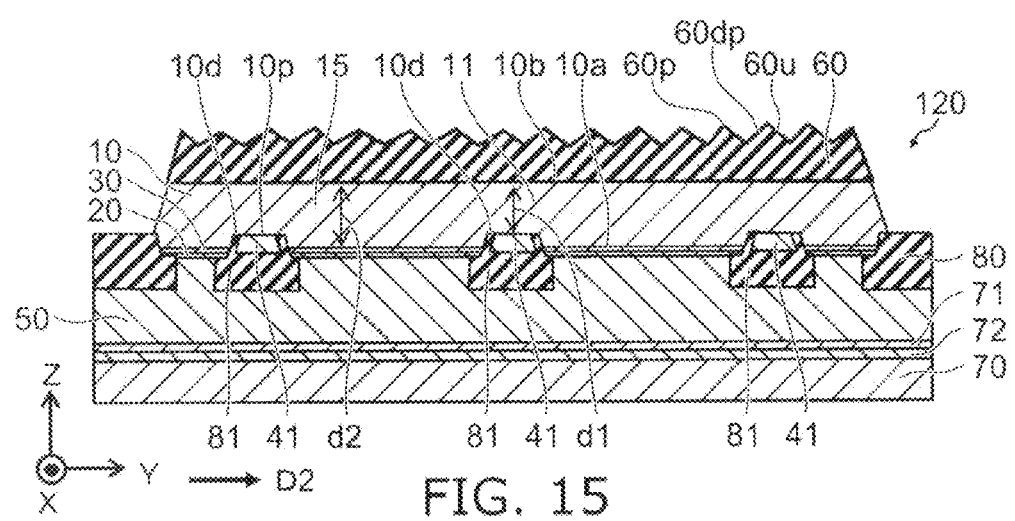
FIG. 15 is a schematic cross-sectional view showing the semiconductor light emitting device according to the second embodiment.
Figure 16:
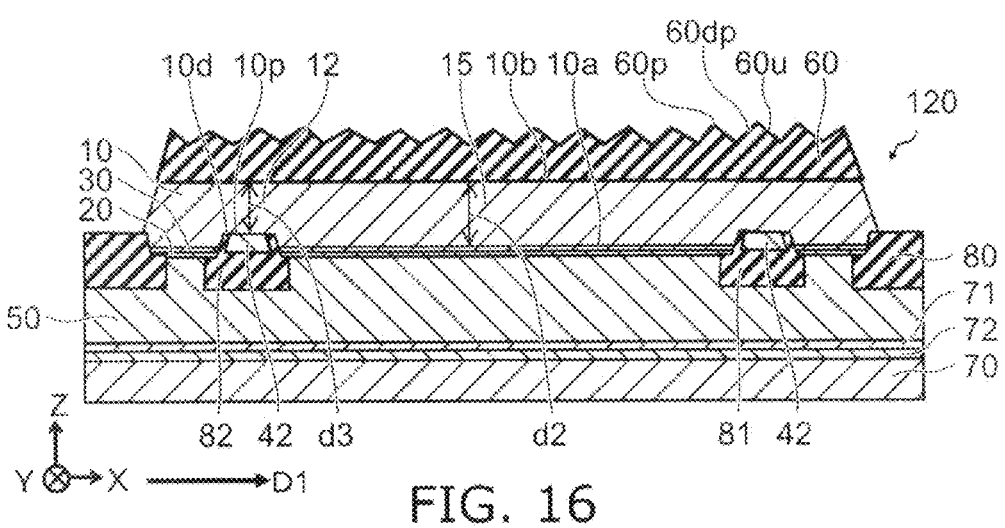
FIG. 16 is a schematic cross-sectional view showing the semiconductor light emitting device according to the second embodiment.

FIG. 14 to FIG. 16 are schematic cross-sectional views showing the semiconductor light emitting device according to the second embodiment.

FIG. 14 is a cross-sectional view along line B1-B2 of FIG. 13. FIG. 15 is a cross-sectional view along line B3-B4 of FIG. 13. FIG. 16 is a cross-sectional view along line B5-B6 of FIG. 15.

As shown in FIG. 14 to FIG. 16, the semiconductor light emitting device 120 includes the electrode layer 50, the first semiconductor layer 10, the light emitting layer 30, and the second semiconductor layer 20. In such a case as well, the first semiconductor layer 10 has the first conductivity type (e.g., the n type). The second semiconductor layer 20 is provided between the electrode layer 50 and the first semiconductor layer 10. The second semiconductor layer 20 is electrically connected to the electrode layer 50. The second semiconductor layer 20 has the second conductivity type (e.g., the p type). The light emitting layer 30 is provided between the first semiconductor layer 10 and the second semiconductor layer 20.

As shown in FIG. 14 and FIG. 15, the first semiconductor layer 10 includes the first thin film portion 11 and the thick film portion 15. The first thin film portion 11 extends in the first direction D1 and has the first thickness d1 in the Z-axis direction. The thick film portion 15 has the second thickness d2. The second thickness d2 is thicker than the first thickness d1.

The first semiconductor layer 10 has the first major surface 10a on the light emitting layer 30 side and the second major surface 10b on the side opposite to the first major surface 10a.

In the example, the first major surface 10a has the recess 10d. The recess 10d is provided along the first thin film portion 11. The recess 10d extends along the first direction D1. The first elongated electrode 41 is disposed at the bottom surface (e.g., the first bottom surface 10p) of the recess 10d. The first elongated electrode 41 contacts the first thin film portion 11. For example, the depth of the recess 10d (corresponding to the absolute value of the difference between the first thickness d1 and the second thickness d2) is not less than 5% and not more than 95% of the thickness of the thick film portion 15.

The semiconductor light emitting device 120 further includes a first inter-layer insulating layer 81. The first elongated electrode 41 is disposed between the first thin film portion 11 and the electrode layer 50. The first inter-layer insulating layer 81 is disposed between the first elongated electrode 41 and the electrode layer 50. The light emitting layer 30 is disposed between the second semiconductor layer 20 and the thick film portion 15. The light emitting layer 30 overlaps the thick film portion 15 and does not overlap the first thin film portion 11 when projected onto the X-Y plane.

In the example, an outer edge insulating layer 80 is provided along the outer edge of the device. The first inter-layer insulating layer 81 may be continuous with the outer edge insulating layer 80 or may be separated from the outer edge insulating layer 80.

In the example, the semiconductor light emitting device 120 further includes the low impurity concentration layer 60. The impurity concentration of the low impurity concentration layer 60 is lower than that of the first semiconductor layer 10.

The low impurity concentration layer 60 includes, for example, a nitride semiconductor. The first semiconductor layer 10 is disposed between the low impurity concentration layer 60 and the light emitting layer 30.

In the example, the unevenness 60dp including the protrusion 60p is provided in the upper surface 60u of the low impurity concentration layer 60.

The first elongated electrode 41 is connected to the pad portion 48. In the example, an insulating layer 84 is provided at a portion between the first elongated electrode 41 and the first semiconductor layer 10. The location where the insulating layer 84 is provided is at a portion of the first elongated electrode 41 on the pad portion 48 side. By providing the insulating layer 84, the current injection region of the light emitting layer 30 is distal to the pad portion 48. Thereby, the light emitting region is distal to the pad portion 48; and the absorption of the emitted light by the pad portion 48 can be suppressed. Thereby, the light extraction efficiency increases.

As shown in FIG. 16, the first semiconductor layer 10 further includes the second thin film portion 12. The second thin film portion 12 extends in the second direction D2 and has the third thickness d3 in the Z-axis direction. The third thickness d3 is thinner than the second thickness d2.

The recess 10d has a portion along the second direction D2. A portion of the recess 10d is provided along the second thin film portion 12. This portion of the recess 10d extends along the second direction D2. The second elongated electrode 42 is disposed at the bottom surface (e.g., the second bottom surface 10q) of the portion of the recess 10d along the second direction D2. The second elongated electrode 42 contacts the second thin film portion 12.

The semiconductor light emitting device 120 further includes a second inter-layer insulating layer 82. The second elongated electrode 42 is disposed between the second thin film portion 12 and the electrode layer 50. The second inter-layer insulating layer 82 is disposed between the second elongated electrode 42 and the electrode layer 50.

The second inter-layer insulating layer 82 may be continuous with the outer edge insulating layer 80 or may be separated from the outer edge insulating layer 80.

At least one selected from the first inter-layer insulating layer 81, the second inter-layer insulating layer 82, and the outer edge insulating layer 80 may include, for example, a metal oxide, a metal nitride, a metal oxynitride, etc. At least one selected from the first inter-layer insulating layer 81, the second inter-layer insulating layer 82, and the outer edge insulating layer 80 may include $SiO_2$, $SiN$, $SiON$, $Al_2O_3$, etc.

The configurations and materials described in regard to the first embodiment are applicable to the first semiconductor layer 10, the second semiconductor layer 20, the light emitting layer 30, the low impurity concentration layer 60, the thick film portion 15, the first thin film portion 11, the second thin film portion 12, the first elongated electrode 41, the second elongated electrode 42, the pad portion 48, the substrate 70, the first intermediate conductive layer 71, and the second intermediate conductive layer 72 of the embodiment.

The configurations described in regard to the semiconductor light emitting devices 111a to 111i, 112a to 112i, 113a to 113i, and 114a to 114i are applicable to the embodiment. In the embodiment as well, cracks can be suppressed.

According to the embodiments, a semiconductor light emitting device in which cracks are suppressed can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In this specification, "perpendicular" and "parallel" are not always exactly perpendicular and parallel and include, for example, variation in the manufacturing process.

In the above, embodiments of the invention have been described with reference to specific examples, however the invention is not limited to these specific examples. For example, specific configurations of various components used in light emitting device such as the first semiconductor layer, the second semiconductor layer, the light emitting layer, the low impurity concentration layer, the electrode layer, the first to fourth elongated electrode, the pad portion and the substrate or the like that are suitably selected from the publicly known ones by those skilled in the art are encompassed within the scope of the invention as long as the configurations can implement the invention similarly and achieve the same effects.

Components in two or more of the specific examples can be combined with each other as long as technically feasible, and such combinations are also encompassed within the scope of the invention as long as they fall within the spirit of the invention.

The light emitting device described above as the embodiments of the invention can be suitably modified and practiced by those skilled in the art, and such modifications are also encompassed within the scope of the invention as long as they fall within the spirit of the invention.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
    an electrode layer;
    a first semiconductor layer of a first conductivity type including a crystal having a cleavage plane, the first semiconductor layer including a first thin film portion extending in a first direction perpendicular to a third direction from the electrode layer toward the first semiconductor layer, the first thin film portion having a first thickness, and a thick film portion arranged with the first thin film portion in a plane perpendicular to the third direction, the thick film portion having a second thickness thicker than the first thickness, and an angle between the first direction and the cleavage plane being not less than 3 degrees and not more than 27 degrees;
    a first elongated electrode extending in the first direction in contact with the first thin film portion;
    a second semiconductor layer of a second conductivity type provided between the electrode layer and the first semiconductor layer and electrically connected to the electrode layer; and
    a light emitting layer provided between the first semiconductor layer and the second semiconductor layer.

2. The device according to claim 1, wherein the crystal is a wurtzite-type crystal having an m-plane, and an angle between the first direction and an intersection line where the m-plane intersects the plane perpendicular to the third direction is not less than 3 degrees and not more than 27 degrees.

3. The device according to claim 2, wherein an absolute value of an angle between the third direction and a c-axis of the wurtzite-type crystal is not more than 3 degrees.

4. The device according to claim 1, wherein
    the first semiconductor layer is a wurtzite-type crystal,
    at least one selected from a (0001) plane and a (000-1) plane of the wurtzite-type crystal is perpendicular to the third direction, and
    an angle between the first direction and a [11-20] direction of the wurtzite-type crystal when projected onto the plane perpendicular to the third direction is not less than 3 degrees and not more than 27 degrees.

5. The device according to claim 1, wherein
    the first semiconductor layer is a wurtzite-type crystal,
    a (10-10) plane of the wurtzite-type crystal intersects the third direction, and
    an angle between the first direction and a [0001] direction of the wurtzite-type crystal when projected onto the plane perpendicular to the third direction is not less than 3 degrees and not more than 27 degrees.

6. The device according to claim 1, wherein
    the first semiconductor layer is a wurtzite-type crystal,
    a (11-20) plane of the wurtzite-type crystal intersects the third direction, and
    an angle between the first direction and a [0001] direction of the wurtzite-type crystal when projected onto the plane perpendicular to the third direction is not less than 3 degrees and not more than 27 degrees.

7. The device according to claim 1, wherein the first semiconductor layer includes a nitride semiconductor, the second semiconductor layer includes a nitride semiconductor, the light emitting layer includes a nitride semiconductor, a crystal orientation of the light emitting layer is the same as a crystal orientation of the first semiconductor layer, and a crystal orientation of the second semiconductor layer is the same as the crystal orientation of the first semiconductor layer.

8. The device according to claim 1, further comprising:
    a second elongated electrode, the first semiconductor layer further including a second thin film portion, the second thin film portion extending in a second direction and arranged with the first thin film portion in the plane perpendicular to the third direction, the second thin film portion having a thickness thinner than the second thickness, the second direction being perpendicular to the third stacking direction to intersect the first direction, and the second elongated electrode extending in the second direction in contact with the second thin film portion.

9. The device according to claim 8, wherein an angle between the first direction and the second direction is not less than 88 degrees and not more than 92 degrees.

10. The device according to claim 8, wherein an angle between the second direction and the cleavage plane is more than 63 degrees and not more than 87 degrees.

11. The device according to claim 1, further comprising a crystal substrate,
    the electrode layer being disposed between the second semiconductor layer and the crystal substrate, and
    a crystal orientation of the crystal substrate being different from a crystal orientation of the first semiconductor layer.

12. The device according to claim 1, wherein the first thin film portion is disposed between the first elongated electrode and the light emitting layer.

13. The device according to claim 12, wherein
the first semiconductor layer has a first major surface on a light emitting layer side and a second major surface on a side opposite to the first major surface,
the second major surface has a recess provided along the first thin film portion, and
the first elongated electrode is disposed at a bottom surface of the recess.

14. The device according to claim 12, wherein the light emitting layer contacts the first thin film portion and the thick film portion.

15. The device according to claim 13, wherein the first major surface is flatter than the second major surface.

16. The device according to claim 12, further comprising a low impurity concentration layer of a nitride semiconductor, an impurity concentration of the low impurity concentration layer being lower than an impurity concentration of the first semiconductor layer,
the thick film portion being disposed between the low impurity concentration layer and the light emitting layer.

17. The device according to claim 1, further comprising a first inter-layer insulating layer,
the first elongated electrode being disposed between the first thin film portion and the electrode layer,
the first inter-layer insulating layer being disposed between the first elongated electrode and the electrode layer, and
the light emitting layer being disposed between the second semiconductor layer and the thick film portion.

18. The device according to claim 17, further comprising a low impurity concentration layer of a nitride semiconductor, an impurity concentration of the low impurity concentration layer being lower than an impurity concentration of the first semiconductor layer, and
the first semiconductor layer being disposed between the low impurity concentration layer and the light emitting layer.

19. The device according to claim 1, wherein an absolute value of a difference between the first thickness and the second thickness is not less than 5% of the thickness of the thick film portion and not more than 95% of the thickness of the thick film portion.

20. A semiconductor light emitting device, comprising:

an electrode layer;

a first semiconductor layer of a first conductivity type including a crystal having a cleavage plane, the first semiconductor layer including a first thin film portion extending in a first direction perpendicular to a third direction from the electrode layer toward the first semiconductor layer, the first thin film portion having a first thickness, and a thick film portion arranged with the first thin film portion in a plane perpendicular to the third direction, the thick film portion having a second thickness thicker than the first thickness;

a first elongated electrode extending in the first direction in contact with the first thin film portion; a second semiconductor layer of a second conductivity type provided between the electrode layer and the first semiconductor layer and electrically connected to the electrode layer; and a light emitting layer provided between the first semiconductor layer and the second semiconductor layer, the crystal being a wurtzite-type crystal, at least one selected from an angle between the third direction and a (10-10) plane of the wurtzite-type crystal and an angle between the third direction and a (11-20) plane of the wurtzite-type crystal being not less than 88 degrees and not more than 92 degrees, and an angle between the first direction and a [0001] direction of the wurtzite-type crystal when projected onto the plane perpendicular to the third direction being not less than 3 degrees and not more than 87 degrees.

* * * * *